United States Patent
Watanabe et al.

(10) Patent No.: US 9,905,516 B2
(45) Date of Patent: Feb. 27, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Masahiro Watanabe, Tochigi (JP); Mitsuo Mashiyama, Oyama (JP); Takuya Handa, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/847,461

(22) Filed: Sep. 8, 2015

(65) Prior Publication Data
US 2015/0380364 A1    Dec. 31, 2015

Related U.S. Application Data

(62) Division of application No. 13/623,913, filed on Sep. 21, 2012, now Pat. No. 9,142,681.

(30) Foreign Application Priority Data

Sep. 26, 2011 (JP) ................................. 2011-208468

(51) Int. Cl.
*H01L 23/00* (2006.01)
*H01L 29/786* (2006.01)

(52) U.S. Cl.
CPC ........ *H01L 23/564* (2013.01); *H01L 29/7869* (2013.01); *H01L 29/78606* (2013.01); *H01L 2924/0002* (2013.01)

(58) Field of Classification Search
CPC ........... H01L 29/78606; H01L 29/7869; H01L 29/786; H01L 21/336; H01L 29/04; H01L 2924/0002
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Park.J et al., "Improvements in the Device Characteristics of Amorphous Indium Gallium Zinc Oxide Thin Film Transistors by Ar Plasma Treatment", Appl. Phys. Lett. (Applied Physics Letters), Jun. 26, 2007, vol. 90, No. 26, pp. 262106-1-262106-3.

(Continued)

*Primary Examiner* — Marcos D Pizarro Crespo
*Assistant Examiner* — Long H Le
(74) *Attorney, Agent, or Firm* — Robinson Intellectual Property Law Office; Eric J. Robinson

(57) ABSTRACT

A metal oxide layer is in contact with an interlayer insulating layer covering a transistor, and has a stacked-layer structure including a first metal oxide layer having an amorphous structure and a second metal oxide layer having a polycrystalline structure. In the first metal oxide layer, there are no crystal grain boundaries, and grid intervals are wide as compared to those in a metal oxide layer in a crystalline state; thus, the first metal oxide layer easily traps moisture between the lattices. In the second metal oxide layer having a polycrystalline structure, crystal parts other than crystal grain boundary portions have dense structures and extremely low moisture permeability. Thus, the structure in which the metal oxide layer including the first metal oxide layer and the second metal oxide layer is in contact with the interlayer insulating layer can effectively prevent moisture permeation into the transistor.

16 Claims, 8 Drawing Sheets

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,683,532 B2 | 3/2010 | Abe et al. |
| 7,726,783 B2 | 6/2010 | Nihei |
| 7,732,819 B2 | 6/2010 | Akimoto et al. |
| 7,994,500 B2 | 8/2011 | Kim et al. |
| 8,148,779 B2 | 4/2012 | Jeong et al. |
| 8,174,178 B2 | 5/2012 | Abe et al. |
| 8,183,099 B2 | 5/2012 | Sakata |
| 8,188,480 B2 | 5/2012 | Itai |
| 8,203,143 B2 | 6/2012 | Imai |
| 8,237,142 B2 | 8/2012 | Cheung et al. |
| 8,420,553 B2 | 4/2013 | Yamazaki |
| 8,450,735 B2 | 5/2013 | Noda |
| 8,455,371 B2 | 6/2013 | Yano et al. |
| 8,803,149 B2 | 8/2014 | Sakata |
| 8,890,407 B2 | 11/2014 | Abe et al. |
| 8,946,097 B2 | 2/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0140277 A1 | 6/2005 | Suzuki et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0097623 A1 | 5/2006 | Abe et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dun Bart |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230391 A1* | 9/2009 | Noshiro ............... H01L 45/04 257/43 |
| 2009/0278122 A1 | 11/2009 | Hosono et al. |
| 2009/0278131 A1* | 11/2009 | Kwon ............... H01L 27/1255 257/72 |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0159639 A1* | 6/2010 | Sakata ............. H01L 21/02565 438/104 |
| 2010/0193782 A1 | 8/2010 | Sakata |
| 2010/0193784 A1* | 8/2010 | Morosawa .......... H01L 29/7869 257/43 |
| 2011/0049510 A1* | 3/2011 | Yamazaki ........... H01L 27/1225 257/43 |
| 2011/0193083 A1 | 8/2011 | Kim et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2011/0281394 A1 | 11/2011 | Yamazaki |
| 2011/0309411 A1 | 12/2011 | Takemura |
| 2011/0312127 A1 | 12/2011 | Ishizuka et al. |
| 2012/0001167 A1 | 1/2012 | Morosawa |
| 2012/0001170 A1 | 1/2012 | Yamazaki |
| 2012/0217500 A1 | 8/2012 | Park et al. |
| 2012/0267598 A1* | 10/2012 | Sakotsubo ........ H01L 21/02183 257/4 |
| 2015/0037912 A1 | 2/2015 | Sakata |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-158172 A | 6/1990 |
| JP | 05-167074 A | 7/1993 |

(56) References Cited

FOREIGN PATENT DOCUMENTS

| JP | 05-251705 A | 9/1993 |
|---|---|---|
| JP | 06-125087 A | 5/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-059939 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-156961 A | 6/2006 |
| JP | 2010-166030 A | 7/2010 |
| JP | 2010-186860 A | 8/2010 |
| JP | 2011-077509 A | 4/2011 |
| JP | 2011-142309 A | 7/2011 |
| WO | WO-2004/114391 | 12/2004 |
| WO | WO-2010/071034 | 6/2010 |
| WO | WO-2010/093051 | 8/2010 |
| WO | WO-2011/027649 | 3/2011 |
| WO | WO-2011/043448 | 4/2011 |
| WO | WO-2011/070892 | 6/2011 |

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-638.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-638.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physcics.

Jeong.J et al., "3.1: Distinguished Paper: 12.1-Inch WXGA AMOLED Display Driven by Indium-Gallium-Zinc Oxide. TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA Amoled Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—Bo Systems [A; Fe, Ga, Or Al; B: Mg, Mn, Fe, Ni, Cu,Or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered al2O3 Gate Insulator", Appl.Phys. Lett. (Applied Physics Letters), Sep. 1, 2003, vol. 83, No. 9, pp. 1755-1757.

Fukumoto.E et al., "High Mobility Oxide Semiconductor TFT for Circuit Integration of AM-OLED", IDW '10 : Proceedings of the 16TH International Display Workshops, Dec. 1, 2010, pp. 631-634.

Fortunato.E et al., "Wide-Bandgap High-Mobility ZNO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15TH International Display Workshops, Dec. 3, 2008, pp. 1637-1640.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Nomura.K et al, "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

(56) References Cited

OTHER PUBLICATIONS

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT", SID Digest '08: SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno. H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda. K et al., "Ultra Low Power Consumption Technologies for Mobile TFT-LCDs ", IDW '02 : Proceedings of the 9TH International Display Workshops, Dec. 4, 2002, pp. 295-298.

Van de Walle. C, "Hydrogen as a Cause of Doping in Zinc Oxide", Phys. Rev. Lett. (Physical Review Letters), Jul. 31, 2000, vol. 85, No. 5, pp. 1012-1015.

Fung. T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong. J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park. J et al., "High performance amorphous oxide thin film transistors with self-aligned top-gate structure", IEDM 09: Technical Digest of International Electron Devices Meeting, Dec. 7, 2009, pp. 191-194.

Kurokawa. Y et al., "UHF RFCPUS on Flexible and Glass Substrates for Secure Reid Systems", Journal of Solid-State Circuits, 2008, vol. 43, No. 1, pp. 292-299.

Ohara. H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates. D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho. D et al., "21.2:Al and SN-Doped Zinc Indium Oxide Thin Film Transistors for Amoled Back-plane", SID Digest '09 : SID International Symposium Digest of Technical Papers, May 31, 2009, pp. 280-283.

Lee. M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin. D et al., "66.2:Distinguished Paper:World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Sakata. J et al., "Development of 4.0-IN. Amoled Display With Driver Circuit Using Amorphous In-Ga-Zn-Oxide TFTS", IDW '09: Proceedings of the 16TH International Display Workshops, 2009, pp. 689-692.

Park. J et al., "Amorphous Indium-Gallium-Zinc Oxide TFTS and Their Application for Large Size Amoled", AM-FPD '08 Digest of Technical Papers, Jul. 2, 2008, pp. 275-278.

Park. S et al., "Challenge to Future Displays: Transparent AM-OLED Driven by Peald Grown ZNO TFT", IMID '07 Digest, 2007, pp. 1249-1252.

Godo. H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada. T et al., "Development of Driver-Integrated Panel Using Amorphous In-Ga-Zn-Oxide TFT", AM-FPD '09 Digest of Technical Papers, Jul. 1, 2009, pp. 33-36.

Hirao. T et al., "Novel Top-Gate Zinc Oxide Thin-Film Transistors (ZNO TFTS) for AMLCDS", J. Soc. INF. Display (Journal of the Society for Information Display), 2007, vol. 15, No. 1, pp. 17-22.

Hosono. H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Characteristics of Amorphous In-Ga-Zn-Oxide TFT", SID Digest '09 : SID International Symposium Digest of Technical Papers, May 31, 2009, pp. 1110-1112.

Ohara, H et al., "21.3:4.0 IN. QVGA Amoled Display Using In-Ga-Zn-Oxide TFTS With a Novel Passivation Layer", SID Digest '09 : SID International Symposium Digest of Technical Papers, May 31, 2009, pp. 284-287.

Miyasaka. M, "Suftla Flexible Microelectronics on Their Way to Business", SID Digest '07 : SID International Symposium Digest of Technical Papers, 2007, vol. 38, pp. 1673-1676.

Chern. H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi. H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka. Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee. H et al., "Current Status of, Challenges to, and Perspective View of AM-OLED ", IDW '06 : Proceedings of the 13th International Display Workshops, Dec. 7, 2006, pp. 663-666.

Kikuchi. H et at., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura. M, "Synthesis of Homologous Compound with New Long-Period Structure", NIRIM Newsletter, Mar. 1, 1995, vol. 150, pp. 1-4.

Kikuchi. H et al., "Polymer-Stabilized Liquid Crystal Blue Phases", Nature Materials, Sep. 2, 2002, vol. 1, pp. 64-68.

Kimizuka. N. et al., "Spinel, YBFE2O4, and YB2FE3O7 Types of Structures for Compounds in the In2O3 and SC2O3-A2O3-BO Systems [A; Fe, Ga, or Al: B: Mg, Mn, Fe, Ni, Cu, or Zn] at Temperatures Over 1000°C", Journal of Solid State Chemistry, 1985, vol. 60, pp. 382-384.

Kitzerow. H et al., "Observation of Blue Phases in Chiral Networks", Liquid Crystals, 1993, vol. 14, No. 3, pp. 911-916.

Costello. M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom. S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, Vol. 39, pp. 629-632.

Orita. M et al., "Mechanism of Electrical Conductivity of Transparent InGaZnO4", Phys. Rev. B (Physical Review, B), Jan. 15, 2000, vol. 61, No. 3, pp. 1811-1816.

Nomura. K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti. A et al., "Native Point Defects in ZnO", Phys. Rev. B (Physical Review. B), Oct. 4, 2007, vol. 76, No. 16, pp. 165202-1-165202-22.

Park. J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh. H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti. A et al., "Oxygen Vacancies in ZnO", Appl. Phys. Lett. (Applied Physics Letters), 2005, vol. 87, pp. 122102-1-122102-3.

Oba. F et al., "Defect energetics in ZnO: A hybrid Hartree-Fock density functional study", Phys. Rev. B (Physical Review. B), 2008, vol. 77, pp. 245202-1-245202-6.

Orita. M et al., "Amorphous transparent conductive oxide InGaO3(ZnO)m (m<4):a Zn4s conductor", Philosophical Magazine, 2001, vol. 81, No. 5, pp. 501-515.

Hosono. H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo. Y et al., "Amorphous Oxide TFT Backplanes for Large Size AMOLED Displays", IDW '08 : Proceedings of the 6th International Display Workshops, Dec. 3, 2008, pp. 581-584.

Kim. S et al., "High-Performance oxide thin film transistors passivated by various gas plasmas", 214th ECS Meeting, 2008, No. 2317, ECS.

Clark. S et al., "First Principles Methods Using CASTEP", Zeitschrift fur Kristallographie, 2005, vol. 220, pp. 567-570.

Lany. S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park. J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh. M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno. K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

SEMICONDUCTOR DEVICE AND METHOD FOR MANUFACTURING THE SAME

BACKGROUND OF THE INVENTION

1. Field of the Invention

One embodiment of the present invention relates to a semiconductor device and a manufacturing method thereof.

Note that a semiconductor device refers to a device which can function by utilizing semiconductor characteristics; an electro-optical device, a semiconductor circuit, and an electronic appliance are all included in the category of the semiconductor device.

2. Description of the Related Art

In the case of forming a thin film transistor (hereinafter also simply referred to as a transistor) which is used for a semiconductor device, an insulating layer formed using a silicon oxide film, a silicon nitride film, or the like is provided over the thin film transistor so as to prevent corrosion of a wiring portion and change in electrical characteristics of the thin film transistor which are caused by permeation of external moisture (for example, see Patent Document 1).

Note that "moisture" in this specification is used as a generic term covering water, water vapor, water molecules, hydrogen molecules, and hydrogen atoms. Note that the expression "moisture permeability is low," for example, is construed that "permeability to one or more of water, water vapor, water molecules, hydrogen molecules, and hydrogen atoms is low."

REFERENCE

Patent Document

[Patent Document 1] Japanese Published Patent Application No. 2003-59939

SUMMARY OF THE INVENTION

As one of methods for achieving an enhanced effect of preventing moisture permeation into a thin film transistor, there is a method in which a crystalline metal oxide layer having low moisture permeability is placed in contact with an insulating layer.

In a crystalline metal oxide layer, however, interfaces between crystal grains (also referred to as grain boundaries), at which atomic arrangement in crystal lattices is irregular or less continuous, have comparatively wide grid intervals as compared to crystal grain portions. For this reason, while the crystal grain portion has extremely low moisture permeability, the crystal grain boundary portion relatively easily transmits moisture as compared to the crystal grain portion.

In view of the above problem, an object of one embodiment of the present invention disclosed in this specification is to provide a semiconductor device in which degradation of electrical characteristics due to moisture is suppressed. Another object is to provide a method for manufacturing the semiconductor device.

The following structure is employed: a metal oxide layer is placed in contact with an insulating layer covering a thin film transistor, and the metal oxide layer includes a first metal oxide layer having an amorphous structure and a second metal oxide layer having a polycrystalline (also referred to as polycrystal) structure.

In the first metal oxide layer having an amorphous structure, while moisture transmits more easily than in a metal oxide layer in a crystalline state, moisture permeation through crystal grain boundary portions does not occur because there are no crystal grain boundaries; moreover, moisture is readily trapped between lattices.

Further, in the second metal oxide layer having a polycrystalline structure, while moisture permeation occurs in crystal grain boundary portions a little more easily than in crystal parts, the crystal parts have dense structures and extremely low moisture permeability.

Thus, when the metal oxide layer includes the first metal oxide layer having an amorphous structure and the second metal oxide layer having a polycrystalline structure, the second metal oxide layer can prevent moisture permeation and the first metal oxide layer can prevent permeation of moisture which enters through the crystal grain boundary portions of the second metal oxide layer (or can take in the moisture). In addition, formation of the metal oxide layer in contact with the insulating layer can further prevent moisture permeation. Therefore, moisture permeation into the thin film transistor can be effectively prevented.

Therefore, one embodiment of the present invention is a semiconductor device which includes a transistor, an insulating layer over the transistor, and a metal oxide layer in contact with the insulating layer. The transistor includes a semiconductor layer, a gate insulating layer, a gate electrode, and a pair of electrodes functioning as a source electrode and a drain electrode. The metal oxide layer at least includes a first metal oxide layer having an amorphous structure and a second metal oxide layer having a polycrystalline structure.

With the structure of one embodiment of the present invention, the insulating layer and the metal oxide layer including the first metal oxide layer and the second metal oxide layer can effectively prevent moisture permeation into a thin film transistor.

Note that the insulating layer over the transistor, the first metal oxide layer, and the second metal oxide layer preferably have either of the following structures.

In the first structure, the insulating layer is placed over the transistor, the first metal oxide layer is placed over the insulating layer, and the second metal oxide layer is placed over the first metal oxide layer. In this structure, permeation of external moisture is blocked by the second metal oxide layer first. Then, the moisture entering through portions which transmit moisture relatively easily such as the crystal grain boundary portions of the second metal oxide layer is blocked by the first metal oxide layer or trapped in the first metal oxide layer. Moreover, permeation of a minute amount of moisture through the first metal oxide layer is blocked by the insulating layer. Thus, moisture outside the second metal oxide layer can be effectively prevented from reaching the transistor.

In the second structure, the first metal oxide layer is placed over the transistor, the second metal oxide layer is placed over the first metal oxide layer, and the insulating layer is placed over the second metal oxide layer. With this structure, even if there are not only permeation of external moisture but also moisture taken in the insulating layer at the time of formation of the insulating layer, or moisture adsorbed at an interface between the second metal oxide layer and the insulating layer, since the first metal oxide layer and the second metal oxide layer are placed between the transistor and the insulating layer, the moisture taken in the insulating layer or the moisture adsorbed at the interface between the second metal oxide layer and the insulating layer can be effectively prevented from reaching the transistor.

In addition, when the semiconductor layer is a film including an oxide semiconductor material, the transistor can have high mobility.

Another embodiment of the present invention is a method for manufacturing a semiconductor device, which includes the following steps: a transistor including a semiconductor layer, a gate insulating layer, a gate electrode, and a pair of electrodes functioning as a source electrode and a drain electrode is formed; an insulating layer is formed over the transistor; a first metal oxide layer having an amorphous structure is formed over the insulating layer; and a second metal oxide layer having a polycrystalline structure is formed over the first metal oxide layer.

When the manufacturing method of one embodiment of the present invention is employed, a semiconductor device which is highly effective in preventing moisture permeation into a transistor can be manufactured.

A further embodiment of the present invention is a method for manufacturing a semiconductor device, which includes the following steps: a transistor including a semiconductor layer, a gate insulating layer, a gate electrode, and a pair of electrodes functioning as a source electrode and a drain electrode is formed; a first metal oxide layer having an amorphous structure is formed over the transistor; a second metal oxide layer having a polycrystalline structure is formed over the first metal oxide layer; and an insulating layer is formed over the second metal oxide layer.

When the manufacturing method of one embodiment of the present invention is employed, a semiconductor device can be provided which is highly effective in preventing not only permeation of external moisture but also permeation of the moisture taken in the insulating layer and the moisture adsorbed at (or taken in) the interface between the second metal oxide layer and the insulating layer.

Note that the first metal oxide layer and the second metal oxide layer are preferably formed successively in the same apparatus, in which case entry of moisture into the first metal oxide layer and the second metal oxide layer and attachment of moisture to an interface between the first metal oxide layer and the second metal oxide layer can be suppressed.

Further, when the first metal oxide layer and the second metal oxide layer are formed using the same target, an increase in takt time due to transfer of a substrate from a deposition chamber to another can be suppressed. In addition, only one kind of target is needed for the formation of the metal oxide layer, so that an increase in manufacturing cost can be suppressed.

Moreover, when a film including an oxide semiconductor material is formed as the semiconductor layer, the transistor can have high mobility.

When the metal oxide layer includes the first metal oxide layer having an amorphous structure and the second metal oxide layer having a polycrystalline structure, the second metal oxide layer can prevent moisture permeation and the first metal oxide layer can prevent permeation of moisture which enters through the crystal grain boundary portions of the second metal oxide layer (or can take in the moisture). In addition, formation of the metal oxide layer in contact with the insulating layer can further prevent moisture permeation. Thus, a semiconductor device in which degradation of electrical characteristics due to moisture is suppressed can be provided. Further, a method for manufacturing the semiconductor device can be provided.

DETAILED DESCRIPTION OF THE INVENTION

Figure 1A:
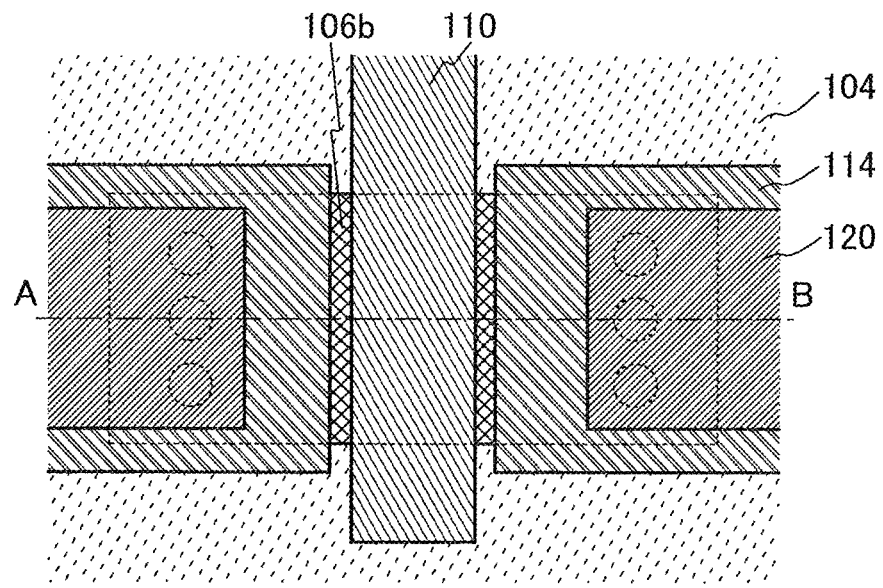
FIGS. 1A and 1B illustrate a structure of a semiconductor device according to one embodiment of the present invention.

Hereinafter, embodiments of the present invention will be described in detail with reference to the accompanying drawings. Note that the present invention is not limited to the description below, and it is easily understood by those skilled in the art that modes and details disclosed herein can be modified in various ways. In addition, the present invention is not construed as being limited to description of the embodiments below.

Further, in embodiments hereinafter described, the same parts are denoted with the same reference numerals throughout the drawings. The thickness, width, relative relation of position, and the like of elements such as a layer and a region illustrated in the drawings are exaggerated for clarification of description of the embodiments in some cases.

Note that in this specification and the like, ordinal numbers such as "first" and "second" are used in order to avoid confusion among components and do not limit the components numerically.

In addition, in this specification and the like, the term "electrode" or "wiring" does not limit a function of a component. For example, an "electrode" is sometimes used as part of a "wiring," and vice versa. In addition, the term "electrode" or "wiring" can also mean a combination of a plurality of "electrodes" or "wirings," for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

In this specification and the like, average surface roughness ($R_a$) is obtained by three-dimensional expansion of arithmetic mean surface roughness ($R_a$) which is defined by JIS B 0601:2001 (ISO 4287:1997) so that $R_a$ can be applied to a curved surface, and is an average value of the absolute values of deviations from a reference surface to a specific surface. $R_a$ is defined by Formula 1 below.

[FORMULA 1]

$$R_a = \frac{1}{S_0} \int_{y_1}^{y_2} \int_{x_1}^{x_2} |f(x, y) - Z_0| dx dy \qquad (1)$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

Embodiment 1

In this embodiment, a semiconductor device including a transistor, according to one embodiment of the present invention and a method for manufacturing the semiconductor device will be described with reference to FIGS. 1A and 1B, FIGS. 2A to 2D, FIGS. 3A to 3D, FIGS. 4A and 4B, and FIGS. 5A and 5B.
(Structure of Semiconductor Device of this Embodiment)

Figure 1B:
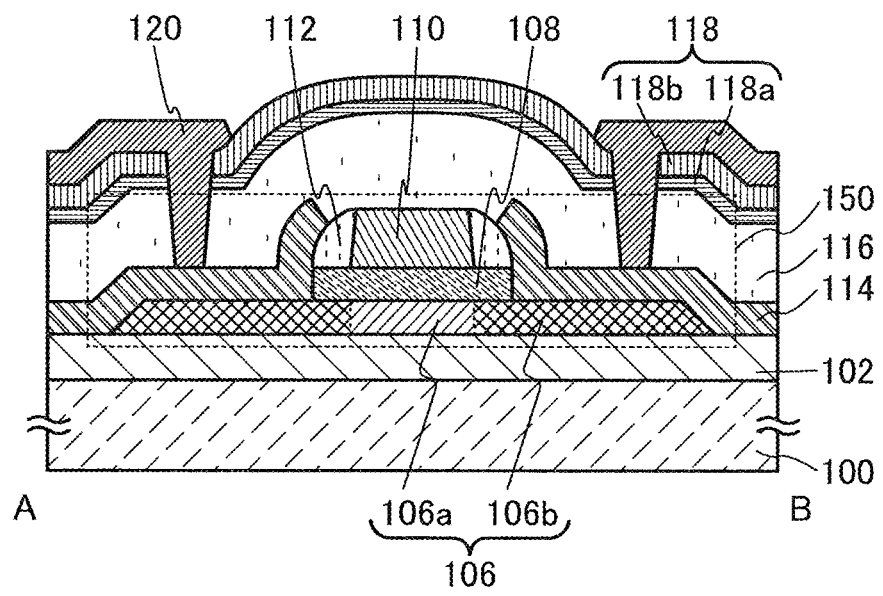

FIGS. 1A and 1B are a top view and a cross-sectional view of a semiconductor device which includes a coplanar transistor having a top-gate top-contact structure. FIG. 1A is a top view of the transistor. FIG. 1B is a cross-sectional view along dashed-dotted line A-B in FIG. 1A. Note that in FIG. 1A, some components are not shown for easy understanding of a structure of the transistor.

As illustrated in FIG. 1B, a transistor 150 includes a substrate 100, a base insulating layer 102 provided over the substrate 100, a semiconductor layer 106 provided over the base insulating layer 102 and having a high-resistance region 106a and low-resistance regions 106b, a gate insulating layer 108 provided over the semiconductor layer 106, a gate electrode 110 provided to overlap with the semiconductor layer 106 with the gate insulating layer 108 provided therebetween, sidewall insulating layers 112 provided in contact with side surfaces of the gate electrode 110, and a pair of electrodes 114 provided in contact with the semiconductor layer 106. Further, over the transistor 150, there are an insulating layer 116 provided to cover the gate electrode 110, the sidewall insulating layers 112, and the pair of electrodes 114; a metal oxide layer 118 provided over the insulating layer 116 and including a first metal oxide layer 118a and a second metal oxide layer 118b; and wirings 120 which are electrically connected to the pair of electrodes 114 through opening portions provided in the insulating layer 116, the first metal oxide layer 118a, and the second metal oxide layer 118b.

What is characteristic in the structure of this embodiment is that the insulating layer 116 and the metal oxide layer 118 are placed over the semiconductor layer 106 where a channel region of the transistor 150 is formed, and that the metal oxide layer 118 has a stacked-layer structure of the first metal oxide layer 118a and the second metal oxide layer 118b.

The insulating layer 116 is formed using an insulating material having low relative permittivity so as to avoid generation of parasitic capacitance between conductive layers (the wirings 120 in this embodiment) which are formed above the insulating layer 116 and conductive layers (the gate electrode 110 and the pair of electrodes 114 in this embodiment) which are formed below the insulating layer 116 as much as possible. Note that when formed using an inorganic material, the insulating layer can be provided with a high barrier property against external moisture permeating the semiconductor layer 106.

For the first metal oxide layer 118a, a metal oxide layer having an amorphous structure is used. In the metal oxide layer having an amorphous structure, there are no crystal grain boundaries, and grid intervals are wide as compared to those in a metal oxide layer in a crystalline state; thus, the metal oxide layer having an amorphous structure easily traps moisture between the lattices.

For the second metal oxide layer 118b, a metal oxide layer having a polycrystalline structure is used. In the metal oxide layer having a polycrystalline structure, crystal parts other than crystal grain boundary portions have dense structures and extremely low moisture permeability.

Therefore, when the semiconductor device has the above-described structure, permeation of external moisture into the transistor 150 can be effectively prevented, allowing suppression of change in electrical characteristics of the semiconductor device of this embodiment which is caused by permeation of external moisture.

Note that in the transistor illustrated in FIGS. 1A and 1B, the low-resistance regions 106b (the regions in the semiconductor layer 106 which are connected to the pair of electrodes 114 serving as a source electrode and a drain electrode, and which can also be called a source region and a drain region) and the high-resistance region 106a (the region in the semiconductor layer 106 which includes a region where a channel portion is formed, and which can also be called a channel formation region) of the semiconductor layer 106 can be formed in a self-aligned manner using the gate electrode 110 as a mask. Thus, a minute transistor can be obtained. Moreover, cost can be low and a yield can be high as compared to those in the case where photolithography or the like is employed to form the high-resistance region 106a and the low-resistance region 106b. In addition, because the low-resistance region 106b and the gate electrode 110 hardly overlap, parasitic capacitance in an overlapped portion is hardly (or not at all) generated, whereby the transistor can operate at high speed.

In the transistor illustrated in FIGS. 1A and 1B, when the transistor is in an on state, current flows from one of the pair of electrodes 114 to the high-resistance region 106a through the low-resistance regions 106b. With the low-resistance regions 106b, deterioration such as hot carrier degradation can be suppressed even in a minute transistor with a short channel length, which can make the transistor highly reliable.

Note that in the transistor illustrated in FIGS. 1A and 1B, regions of the semiconductor layer 106 which overlap with the sidewall insulating layers 112 are included in the low-resistance regions 106b; however, the present invention is not limited thereto. For example, the regions of the semiconductor layer 106 which overlap with the sidewall insulating layers 112 may be included in the high-resistance region 106a. The above-described deterioration such as hot carrier degradation can be further reduced in the case of employing such a structure. In the case where the above-described structure is employed, the low-resistance regions 106b and the high-resistance region 106a can be formed in the semiconductor layer 106 in a self-aligned manner using the gate electrode 110 and the sidewall insulating layers 112 as masks.

(Manufacturing Method of Semiconductor Device of this Embodiment)

A method for manufacturing the transistor illustrated in FIGS. 1A and 1B will be described with reference to FIGS. 2A to 2D, FIGS. 3A to 3D, and FIGS. 4A and 4B.

Figure 2A:
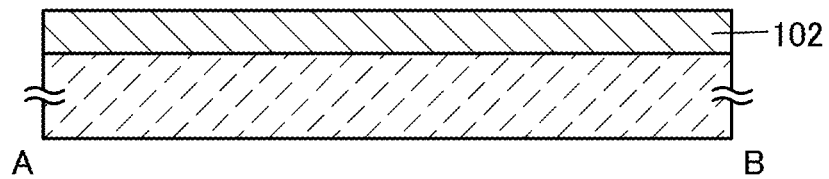
FIGS. 2A to 2D illustrate a method for manufacturing a semiconductor device, according to one embodiment of the present invention.

First, the base insulating layer 102 is formed over the substrate 100 (see FIG. 2A).

For the substrate 100, a glass material such as aluminosilicate glass, aluminoborosilicate glass, or barium borosilicate glass is used. In the mass production, a mother glass with the following size is preferably used for the substrate 100: the 8th generation (2160 mm×2460 mm); the 9th generation (2400 mm×2800 mm, or 2450 mm×3050 mm); the 10th generation (2950 mm×3400 mm); or the like. A mother glass considerably shrinks when the treatment temperature is high and the treatment time is long. Thus, in the case where mass production is performed with the use of the mother glass, the heating temperature in the manufacturing process is preferably 700° C. or lower, further preferably 450° C. or lower, still further preferably 350° C. or lower.

The base insulating layer 102 is formed by a PECVD method or a sputtering method to have a thickness greater than or equal to 50 nm and less than or equal to 600 nm with the use of one of a silicon oxide film, a gallium oxide film, an aluminum oxide film, a silicon nitride film, a silicon oxynitride film, an aluminum oxynitride film, and a silicon nitride oxide film or a stacked-layer film including any of these films. Formation of the base insulating layer 102 can suppress permeation of impurities from the substrate 100 side into the semiconductor layer 106 which is formed in a later step. Note that the base insulating layer 102 is not necessarily provided; for example, in the case where the impurity content in the substrate 100 is sufficiently low, the base insulating layer 102 may be omitted.

Note that in an "oxynitride" in this specification such as silicon oxynitride, the oxygen content is higher than the nitrogen content. Further, in a "nitride oxide" such as silicon nitride oxide, the nitrogen content is higher than the oxygen content.

Note that in the case where a layer including an oxide semiconductor material is used as the semiconductor layer 106 which is formed in the later step, electric charge can be generated due to oxygen vacancies in the semiconductor layer 106. In general, some of oxygen vacancies in an oxide semiconductor layer serve as a donor and causes release of an electron which is a carrier. As a result, the threshold voltage of the transistor shifts in the negative direction. Thus, for the base insulating layer 102, an insulating film from which oxygen is released by heat treatment is preferably used. In this manner, oxygen vacancies in the semiconductor layer 106, which cause a negative shift in the threshold voltage, can be reduced. For easier crystal growth in the semiconductor layer 106 which is formed in the later step, it is preferable that the base insulating layer 102 be sufficiently flat.

The above expression "release oxygen by heat treatment" means that the released amount of oxygen which is converted into oxygen atoms is estimated to be $1.0 \times 10^{18}$ atoms/cm$^3$ or higher, preferably $3.0 \times 10^{20}$ atoms/cm$^3$ or higher in thermal desorption spectroscopy (TDS) analysis.

Here, a method in which the amount of released oxygen is measured by conversion into oxygen atoms using TDS analysis will be described.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the amount of the released oxygen molecules ($N_{O2}$) from an insulating film can be obtained according to Formula 2 below with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal

[FORMULA 2]

$$N_{O2} = \frac{N_{H2}}{S_{H2}} \times S_{O2} \times a \qquad (2)$$

$N_{H2}$ is the value obtained by conversion of the amount of hydrogen molecules released from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient affecting the intensity of the spectrum in the TDS analysis. Refer to Japanese Published Patent Application No. H6-275697 for details of Formula 2. Note that the amount of released oxygen from the above insulating film is measured with a thermal desorption spectroscopy apparatus produced by ESCO Ltd., EMD-WA1000S/W, using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen when converted into oxygen atoms is twice the amount of the released oxygen molecules.

In the above structure, the layer from which oxygen is released by heat treatment may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

Figure 2B:
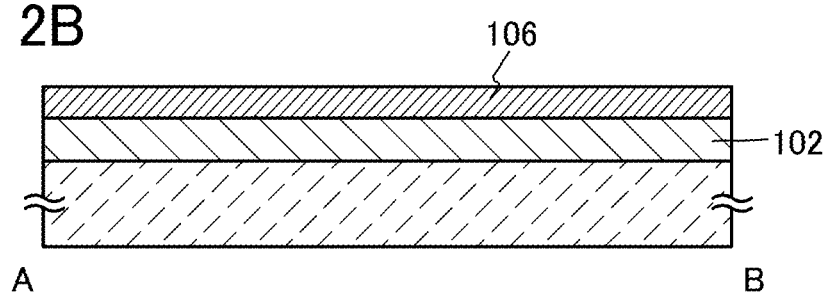

Then, the semiconductor layer 106 is formed by a sputtering method, an evaporation method, a PECVD method, a PLD method, an atomic layer deposition (ALD) method, a molecular beam epitaxy (MBE) method, or the like (see FIG. 2B). For the semiconductor layer 106, a silicon film such as an amorphous silicon film, a polycrystalline silicon film, a microcrystalline (also referred to as microcrystal or semi-amorphous silicon) silicon film, or a single crystal silicon film can be used. Alternatively, a compound semiconductor film such as a gallium arsenide film or a silicon germanium film can be used. Further alternatively, a film including an oxide semiconductor material (hereinafter referred to as an oxide semiconductor layer) may be used. In recent years, a transistor in which an oxide semiconductor material is used for a semiconductor layer has been actively researched and developed. In view of this circumstance, the structure in which an oxide semiconductor layer is used as the semiconductor layer 106 is described below. It is needless to say that the semiconductor layer 106 is not limited to an oxide semiconductor layer.

The semiconductor layer 106 is preferably formed such that impurities which are not main components of the semiconductor layer 106 and serve as carrier donors are contained as little as possible. Therefore, a material (e.g., a target used in a sputtering apparatus) and a film formation atmosphere for formation of the semiconductor layer 106 are preferably a highly purified material and a highly purified atmosphere which contain impurities serving as carrier donors as little as possible.

When the semiconductor layer 106 contains an alkali metal or an alkaline earth metal, the alkali metal or the alkaline earth metal and an oxide semiconductor are bonded to each other, so that carriers are generated in some cases, which causes an increase in the off-state current of a transistor. Accordingly, the concentration of an alkali metal or an alkaline earth metal in the semiconductor layer 106 is $1\times10^{18}$ atoms/cm$^3$ or lower, preferably $2\times10^{16}$ atoms/cm$^3$ or lower.

Further, when the semiconductor layer 106 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the semiconductor layer 106 is preferably lower than $5\times10^{18}$ atoms/cm$^3$, more preferably $1\times10^{18}$ atoms/cm$^3$ or lower, still more preferably $5\times10^{17}$ atoms/cm$^3$ or lower, further more preferably $1\times10^{16}$ atoms/cm$^3$ or lower. Note that the concentration of hydrogen in the semiconductor layer 106 is measured by secondary ion mass spectrometry (SIMS).

In an oxide semiconductor where defect levels in an energy gap due to oxygen vacancies are reduced by sufficiently reducing the concentration of hydrogen and supplying a sufficient amount of oxygen, the carrier density can be lower than $1\times10^{12}$/cm$^3$, preferably lower than $1\times10^{11}$/cm$^3$, further preferably lower than $1.45\times10^{10}$/cm$^3$. For example, the off-state current (per unit channel width (1 μm) here) at room temperature (25° C.) is 100 zA (1 zA (zeptoampere) is $1\times10^{-21}$ A) or less, preferably 10 zA or less. In this manner, an oxide semiconductor in which impurities such as hydrogen are sufficiently removed and a sufficient amount of oxygen is supplied is used for the semiconductor layer 106, whereby a transistor with extremely favorable off-state current characteristics can be obtained.

Note that off-state current refers to drain current which flows in a transistor in an off state. An off state of a transistor refers to a state where gate voltage is lower than threshold voltage in an n-channel transistor. Alternatively, an off state of a transistor refers to a state where gate voltage is higher than threshold voltage in a p-channel transistor. Drain current refers to current between a source and a drain of a transistor. Further, gate voltage refers to a potential difference between a source potential and a gate potential when the source potential is used as a reference potential.

In some cases, off-state current refers to drain current which flows in a normally-off transistor when gate voltage is 0 V. A normally-off transistor refers to an n-channel transistor whose threshold voltage is higher than 0 V. Alternatively, a normally-off transistor refers to a p-channel transistor whose threshold voltage is lower than 0 V.

The concentration of hydrogen in the semiconductor layer 106, which is measured by secondary ion mass spectrometry (SIMS), is lower than $5\times10^{19}$ cm$^{-3}$, preferably $5\times10^{18}$ cm$^{-3}$ or lower, more preferably $1\times10^{18}$ cm$^{-3}$ or lower, still more preferably $5\times10^{17}$ cm$^{-3}$ or lower. Further, as for alkali metal concentration, which is measured by SIMS, the concentration of sodium is $5\times10^{16}$ cm$^{-3}$ or lower, preferably $1\times10^{16}$ cm$^{-3}$ or lower, more preferably $1\times10^{15}$ cm$^{-3}$ or lower. The concentration of lithium is $5\times10^{15}$ cm$^{-3}$ or lower, preferably $1\times10^{15}$ cm$^{-3}$ or lower. The concentration of potassium is $5\times10^{15}$ cm$^{-3}$ or lower, preferably $1\times10^{15}$ cm$^{-3}$ or lower.

The semiconductor layer 106 can be single crystal, polycrystalline (also referred to as polycrystal), or amorphous, for example.

The semiconductor layer 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

Note that the transistor in which the CAAC-OS film is used as a semiconductor layer can have higher mobility than a transistor in which an oxide semiconductor film in an amorphous state is used as a semiconductor layer by improvement in surface flatness. In order to improve the surface flatness, the semiconductor layer is preferably formed over a flat surface. Specifically, the semiconductor layer is preferably formed over a surface with the average surface roughness ($R_a$) of 1 nm or lower, preferably 0.3 nm or lower, more preferably 0.1 nm or lower. Note that the average surface roughness ($R_a$) is preferably close to 0. In this embodiment, a surface of the base insulating layer 102 or that of the semiconductor layer 106 may be made to have the above flatness.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

In the transistor where the CAAC-OS film is used as the semiconductor layer 106 (at least the high-resistance region 106a), change in electrical characteristics due to irradiation with visible light or ultraviolet light can be reduced. Thus, the transistor has high reliability.

Note that part of oxygen included in the oxide semiconductor film may be substituted with nitrogen.

The semiconductor layer 106 can be formed by a sputtering method, an MBE method, a pulsed laser deposition method, an ALD method, or the like as appropriate. In this embodiment, the semiconductor layer 106 can be formed using a sputtering apparatus which performs film formation with surfaces of a plurality of substrates set substantially perpendicular to a surface of a sputtering target.

The thickness of the semiconductor layer 106 can be greater than or equal to 1 nm and less than or equal to 100 nm, preferably greater than or equal to 3 nm and less than or equal to 40 nm, more preferably greater than or equal to 5 nm and less than or equal to 20 nm. In particular, in the case of the transistor whose channel length is 30 nm or less, when the semiconductor layer 106 has a thickness of around 5 nm, a short channel effect can be suppressed and stable electrical characteristics can be obtained.

To form a CAAC-OS film as the semiconductor layer 106, the film formation is performed by a sputtering method with a polycrystalline oxide semiconductor sputtering target, for example. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Note that before the deposition of the semiconductor layer 106, it is preferable that a deposition chamber be heated and evacuated to remove impurities such as moisture in the deposition chamber. It is particularly important to remove the impurities adsorbed on an inner wall of the deposition chamber. Here, heat treatment may be performed at a temperature higher than or equal to 100° C. and lower than or equal to 450° C., for example. The deposition chamber is preferably evacuated with a rough vacuum pump such as a dry pump and a high vacuum pump such as a sputter ion pump, a turbo molecular pump, or a cryopump in appropriate combination. The turbo molecular pump has an outstanding capability of evacuating large-sized molecules, whereas it has a low capability of evacuating moisture or hydrogen. Further, it is effective to use a combination of the turbo molecular pump and a cryopump having a high capability of evacuating moisture or a sputter ion pump having a high capability of evacuating hydrogen. At this time, when impurities are removed while an inert gas is introduced, the rate of elimination of moisture or the like, which is difficult to eliminate only by evacuation, can be further increased. By removing impurities in the deposition chamber by such treatment before the deposition of the oxide semiconductor, entry of hydrogen, moisture, a hydroxyl group, hydride, and the like into the semiconductor layer 106 can be suppressed.

An oxide semiconductor used for forming the oxide semiconductor layer 106 preferably contains at least indium (In) or zinc (Zn). In particular, the oxide semiconductor preferably contains In and Zn. In addition, as a stabilizer for reducing the variation in electrical characteristics of a transistor using the oxide, gallium (Ga) is preferably additionally contained. Tin (Sn) is preferably contained as a stabilizer. Hafnium (Hf) is preferably contained as a stabilizer.

Aluminum (Al) is preferably contained as a stabilizer. Titanium (Ti) is preferably contained as a stabilizer. Zirconium (Zr) is preferably contained as a stabilizer.

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The semiconductor layer 106 is preferably formed using a material whose band gap is 2.5 eV or more, preferably 2.8 eV or more, further preferably 3.0 eV or more in order to reduce the off-state current of the transistor.

The off-resistance of the transistor (resistance between source and drain when the transistor is in an off-state) is inversely proportional to the concentration of carriers thermally excited in the semiconductor layer where a channel is formed. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1 \times 10^{11}$ cm$^{-3}$.

On the other hand, in the case of a semiconductor whose band gap is 3.2 eV (an oxide semiconductor, here), the concentration of thermally excited carriers is approximately $1 \times 10^{-7}$ cm$^{-3}$. When the electron mobility is the same, the resistivity is inversely proportional to the carrier concentration; therefore, the resistivity of the semiconductor whose band gap is 3.2 eV is 18 orders of magnitude higher than that of silicon.

Such a transistor in which an oxide semiconductor having a wide band gap is used for the semiconductor layer 106 (OS transistor) can realize an extremely small off-state current.

For the semiconductor layer 106, for example, any of the following can be used: a single-component metal oxide such as indium oxide, tin oxide, or zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In, Ga, and Zn. The In—Ga—Zn-based oxide may contain a metal element other than the In, Ga, and Zn.

Alternatively, for the semiconductor layer 106, an oxide represented by InMO$_3$(ZnO)$_m$ (m>0 is satisfied, and m is not an integer) may be used. Note that M represents one or more metal elements selected from Ga, Fe, Mn, and Co. Alternatively, as the oxide semiconductor, a material represented by In$_2$SnO$_5$(ZnO)$_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of In—Ga—Zn-based oxides whose composition is in the neighborhood of the above compositions can be used for the semiconductor layer 106. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of In—Sn—Zn-based oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

In the case of depositing an In—Ga—Zn-based oxide for the semiconductor layer 106 by a sputtering method, it is preferable to use an In—Ga—Zn—O target having the following atomic ratio: the atomic ratio of In:Ga:Zn is 1:1:1, 4:2:3, 3:1:2, 1:1:2, 1:3:2, 2:1:3, or 3:1:4. When the semiconductor layer 106 is formed using an In—Ga—Zn—O target having the aforementioned atomic ratio, a polycrystalline film or a CAAC-OS film is easily formed.

In the case of depositing an In—Sn—Zn-based oxide for the semiconductor layer 106 by a sputtering method, it is preferable to use an In—Sn—Zn—O target having the following atomic ratio: the atomic ratio of In:Sn:Zn is 1:1:1, 2:1:3, 1:2:2, or 20:45:35. When the semiconductor layer 106 is formed using an In—Sn—Zn—O target having the aforementioned atomic ratio, a polycrystalline film or a CAAC-OS film is easily formed.

In the case of depositing an In—Zn-based oxide for the semiconductor layer 106 by a sputtering method, it is preferable to use an In—Zn—O target having an atomic ratio of In:Zn=50:1 to 1:2 (In$_2$O$_3$:ZnO=25:1 to 1:4 in a molar ratio), preferably, In:Zn=20:1 to 1:1 (In$_2$O$_3$:ZnO=10:1 to 1:2 in a molar ratio), further preferably, In:Zn=15:1 to 1.5:1 (In$_2$O$_3$:ZnO=15:2 to 3:4 in a molar ratio). When the semiconductor layer 106 is formed using an In—Zn—O target having the aforementioned atomic ratio, a polycrystalline film or a CAAC-OS film is easily formed.

Note that although in the above description, the atomic ratio of the metal elements in the target used for the formation of the semiconductor layer 106 is expressed with integers, the atomic ratio of the metal elements in the target may vary a little from the above-mentioned values when the atomic ratio of the metal elements included in the semiconductor layer 106 is set to integers. For example, in the case where the semiconductor layer 106 in which In:Ga:Zn=1:1:1 is formed, a target having a composition ratio of In$_2$O$_3$:

Ga$_2$O$_3$:ZnO=1+α:1+β:1+γ [molar ratio] can be used. Although the values of α, β, and γ vary depending on the film formation conditions, the values are in a range of approximately greater than or equal to −0.5 and less than or equal to 0.5.

The semiconductor layer 106 is preferably formed under conditions such that much oxygen is contained during film formation (for example, by a sputtering method in an atmosphere where the proportion of oxygen is 100%) so as to be a layer containing much oxygen (preferably including a region containing oxygen in excess of the stoichiometric composition in the semiconductor layer).

The deposition atmosphere may be a rare gas (typically argon) atmosphere, an oxygen atmosphere, or a mixed atmosphere containing a rare gas and oxygen. Here, in the case where a volume ratio of oxygen is made to be higher than that of the rare gas at the time of the deposition, much oxygen is taken in the semiconductor layer 106, so that oxygen vacancies in the semiconductor layer 106 can be reduced. Further, in order to prevent moisture from entering the semiconductor layer 106, it is preferable to use an atmosphere of a high-purity gas from which moisture is sufficiently removed.

Note that when a CAAC-OS film is used for the semiconductor layer 106, the CAAC-OS film may have a structure in which a plurality of oxide semiconductor films are stacked. For example, the semiconductor layer 106 may be a stack of a first oxide semiconductor film, a second oxide semiconductor film, and a third oxide semiconductor film which have different compositions. For example, the following structure can be employed: the first oxide semiconductor film and the third oxide semiconductor film are formed using three-component metal oxides and the second oxide semiconductor film is formed using a two-component metal oxide; or the first oxide semiconductor film and the third oxide semiconductor film are formed using two-component metal oxides and the second oxide semiconductor film is formed using a three-component metal oxide.

Further, the constituent elements of the first oxide semiconductor film, the second oxide semiconductor film, and the third oxide semiconductor film may be the same and the compositions of the constituent elements of the first oxide semiconductor film, the second oxide semiconductor film, and the third oxide semiconductor film may be different. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may have an atomic ratio of In:Ga:Zn=1:3:2, and the second oxide semiconductor film may have an atomic ratio of In:Ga:Zn=3:1:2.

At this time, the second oxide semiconductor film preferably contains more In than Ga. Further, the first oxide semiconductor film and the third oxide semiconductor film preferably contain In and Ga at a proportion of In≤Ga.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

Note that when the film (the base insulating layer 102, an insulating layer 107, or the like in the drawings) which is in contact with and is different from the oxide semiconductor film is formed, an impurity might be diffused into the oxide semiconductor film from the film formed to be in contact with the oxide semiconductor film. For example, when silicon, carbon, or the like contained in the base insulating layer 102 or the insulating layer 107 is diffused into the oxide semiconductor film, electrical characteristics of the transistor may be adversely affected.

However, the adverse effect on the electrical characteristics of the transistor (e.g., a reduction in mobility) which is attributed to impurity diffusion can be reduced when a stacked-layer structure of the oxide semiconductor films is provided as described above and the oxide semiconductor film (i.e., the oxide semiconductor film having a composition of In≤Ga; the first oxide semiconductor film and the third oxide semiconductor film in this embodiment) which has fewer oxygen vacancies and more stable characteristics than the oxide semiconductor film that has high mobility (i.e., the oxide semiconductor film having a composition of In>Ga; the second oxide semiconductor film in this embodiment) is provided in contact with the oxide semiconductor film that has high mobility, whereby the oxide semiconductor film that has high mobility is provided apart from the film (the base insulating layer 102, the insulating layer 107, or the like in the drawings) which is in contact with the stacked-layer structure of the oxide semiconductor films. In this manner, the mobility and reliability of the transistor can be improved.

Further, after the semiconductor layer 106 is formed, heat treatment for removal of moisture taken in the semiconductor layer 106 (dehydration or dehydrogenation) may be performed. The heat treatment can further remove moisture in the semiconductor layer 106. The heat treatment is performed under an inert gas atmosphere at a temperature higher than or equal to 250° C. and lower than or equal to 700° C., preferably higher than or equal to 450° C. and lower than or equal to 600° C., or lower than a strain point of the substrate. Note that the inert gas atmosphere is preferably an atmosphere which contains nitrogen or a rare gas (such as helium, neon or argon) as its main component and does not contain moisture, hydrogen or the like. For example, the purity of nitrogen or a rare gas such as helium, neon, or argon introduced into a heat treatment apparatus can be set to 6N (99.9999%) or more, preferably 7N (99.99999%) or more (i.e., the impurity concentration is 1 ppm or less, preferably 0.1 ppm or less).

For example, after the substrate is introduced into an electric furnace including a resistance heater or the like, the heat treatment can be performed at 450° C. under a nitrogen atmosphere for one hour.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to high temperature of 650° C. to 700° C. because the heat treatment time is short.

The above heat treatment can be referred to as dehydration treatment, dehydrogenation treatment, or the like because of its advantageous effect of removing moisture. The timing of performing the heat treatment is not limited to the timing just after the formation of the semiconductor layer 106; for example, the heat treatment can be performed at another timing such as the timing after the semiconductor layer 106 is processed into an island shape. Such dehydration treatment or dehydrogenation treatment may be conducted once or plural times.

Further, after the semiconductor layer 106 is heated by the heat treatment, heat treatment for adding oxygen to the semiconductor layer 106 (also referred to as supply of oxygen) may be performed in the same furnace. The heat treatment may be performed at a temperature higher than or equal to 200° C. and lower than the strain point of the substrate in a heat treatment apparatus to which a high-purity oxygen gas, a high-purity $N_2O$ gas, or ultra dry air (with a moisture content of 20 ppm (−55° C. by conversion into a dew point) or less, preferably 1 ppm or less, further preferably 10 ppb or less, in the case where measurement is performed with the use of a dew point meter of a cavity ring down laser spectroscopy (CRDS) system) is introduced. The heat treatment is performed preferably at a temperature higher than or equal to 250° C. and lower than or equal to 450° C. It is preferable that moisture, hydrogen, and the like be not contained in these gases in particular. The purity of the oxygen gas or the $N_2$ gas that is introduced into the same furnace is preferably 6N or more, more preferably 7N or more (i.e., the impurity concentration is preferably 1 ppm or less, more preferably 0.1 ppm or less). Through this step, oxygen vacancies in the semiconductor layer 106 generated by dehydration or dehydrogenation treatment can be compensated.

Note that the above heat treatment has an advantageous effect for compensating oxygen vacancies generated in the semiconductor layer 106 by dehydration treatment or dehydrogenation treatment; thus, the heat treatment can also be referred to as oxygen supplying treatment or the like. As in the case of the dehydration treatment or dehydrogenation treatment, this heat treatment can also be performed at another timing such as the timing after the semiconductor layer 106 is processed into an island shape. In addition, this heat treatment may be conducted once or plural times.

By performing the above heat treatment on the semiconductor layer 106, the impurity levels in the film can be significantly reduced. Accordingly, the field-effect mobility of the transistor can be increased so as to be close to ideal field-effect mobility.

Figure 2C:
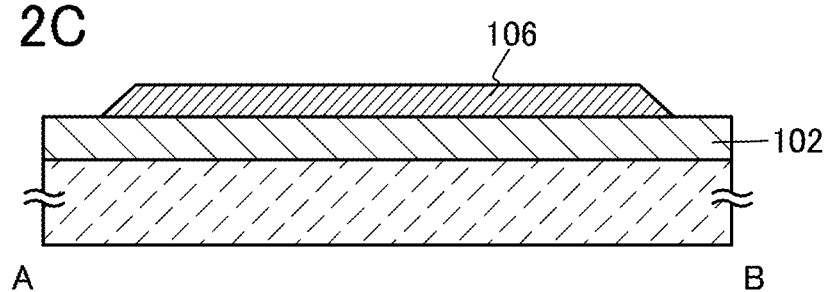
Figure 2D:
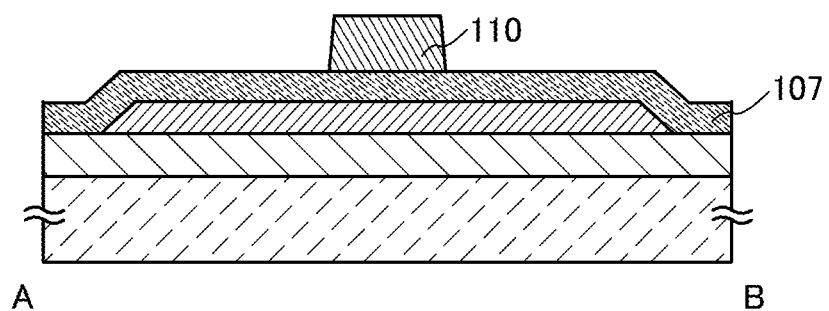

Next, the semiconductor layer 106 is processed into an island shape by a photolithography process or the like (see FIG. 2C).

Then, the insulating layer 107 and a conductive layer are formed in this order over the semiconductor layer 106 by a sputtering method, an evaporation method, a PECVD method, a PLD method, an ALD method, an MBE method, or the like. The conductive layer is processed by a photolithography process or the like, so that the gate electrode 110 is formed (see FIG. 2D).

For the insulating layer 107, a material and a method similar to those for the base insulating layer 102 can be used. Note that as in the case of the base insulating layer 102, an insulating layer from which oxygen is released by heat treatment (preferably an insulating layer which includes a region containing oxygen in excess of the stoichiometric composition in the insulating layer) is preferably used as the insulating layer 107. Thus, oxygen can be prevented from moving from the semiconductor layer 106 to the insulating layer 107, and oxygen can be supplied from the insulating layer 107 to the semiconductor layer 106.

The gate electrode 110 may be formed by a sputtering method or the like to have a single-layer structure or a stacked-layer structure using one or more of aluminum, titanium, chromium, cobalt, nickel, copper, molybdenum, silver, tantalum, and tungsten, a nitride of any of these elements, an oxide of any of these elements, and an alloy of any of these elements. Alternatively, an oxide or an oxynitride which contains at least In and Zn may be used. For example, an In—Ga—Zn—O—N-based material can be used.

Then, by an ion doping method or an ion implantation method, impurity ions 130 which have a function of reducing the resistance value of the semiconductor layer 106 are added to the semiconductor layer 106 through the insulating layer 107. At this time, the gate electrode 110 serves as a mask, so that the semiconductor layer 106 including the high-resistance region 106a and the low-resistance regions 106b is formed in a self-aligned manner (see FIG. 3A). Note that because an ion implantation method uses a mass separator with which only necessary ions (the impurity ions 130 in this embodiment) are extracted, only the impurity ions 130 can be selectively added to an object (the semiconductor layer 106 in this embodiment) by an ion implantation method. An ion implantation method is thus preferably employed, in which case entry of impurities (e.g., hydrogen) into the semiconductor layer 106 is reduced as compared to the case where the ions are added by an ion doping method. Note that the use of an ion doping method is not excluded.

Note that by addition of the impurity ions 130 through the insulating layer 107, damage (e.g., generation of lattice defects in the semiconductor layer 106) caused at the time of addition of the impurity ions 130 into the semiconductor layer 106 can be reduced.

Figure 3A:
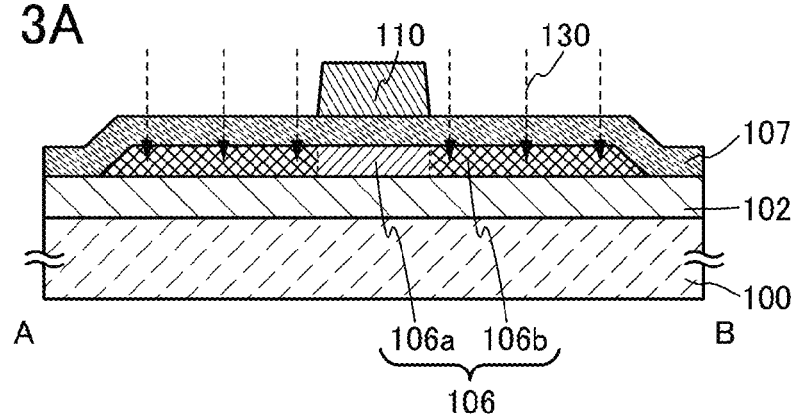
FIGS. 3A to 3D illustrate a method for manufacturing a semiconductor device, according to one embodiment of the present invention.
Figure 3B:
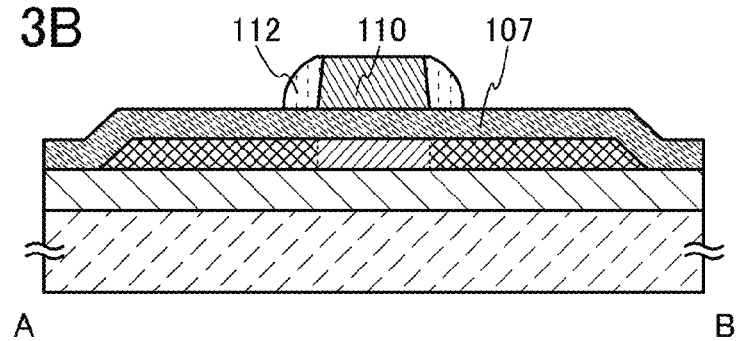

Next, an insulating layer is formed with the use of a material and a method similar to those for the base insulating layer 102 and then etched, so that the sidewall insulating layers 112 are formed (see FIG. 3B). The sidewall insulating layers 112 can be formed in a self-aligned manner by performing highly anisotropic etching on the insulating layer. For example, dry etching is preferably employed. As an etching gas used for dry etching, for example, a gas including fluorine such as trifluoromethane, octafluorocyclobutane, or tetrafluoromethane can be used. A rare gas or hydrogen may be added to the etching gas. As the dry etching, a reactive ion etching (RIE) method in which high-frequency voltage is applied to a substrate, is preferably used.

Figure 3C:
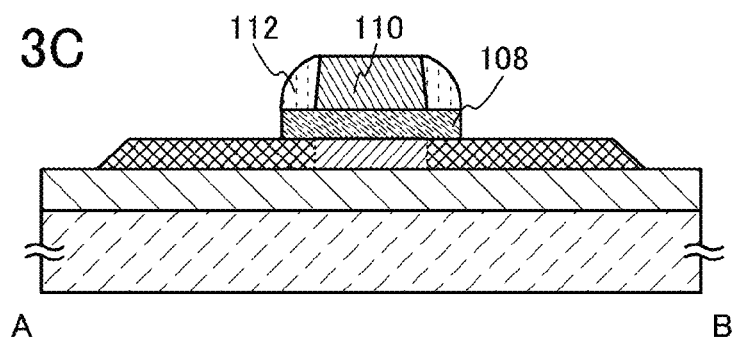
Figure 3D:
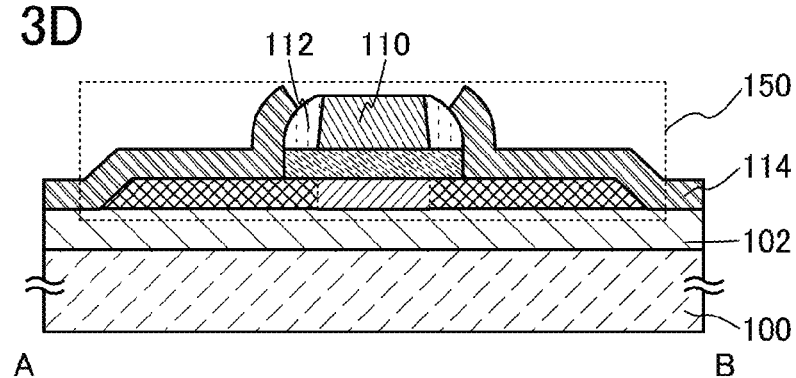

After the sidewall insulating layers 112 are formed, the insulating layer 107 is processed using the gate electrode 110 and the sidewall insulating layers 112 as masks, so that the gate insulating layer 108 is formed (see FIG. 3C).

Note that although the impurity ions 130 are added to the semiconductor layer 106 using the gate electrode 110 as a mask just after the formation of the gate electrode 110 in this embodiment, the impurity ions 130 may be added to the semiconductor layer 106 after the formation of the sidewall insulating layers 112, with the use of the gate electrode 110 and the sidewall insulating layers 112 as masks. In this manner, regions of the semiconductor layer 106 which overlap with the sidewall insulating layers 112 can be included in the high-resistance region 106a.

Then, over the semiconductor layer 106, the gate electrode 110, and the sidewall insulating layers 112, a conductive film is formed with a material and a method similar to those for the gate electrode 110, and is processed by a photolithography process or the like, so that the pair of electrodes 114 which function as the source electrode and the drain electrode are formed. Thus, the transistor 150 is formed (see FIG. 3D).

Figure 4A:
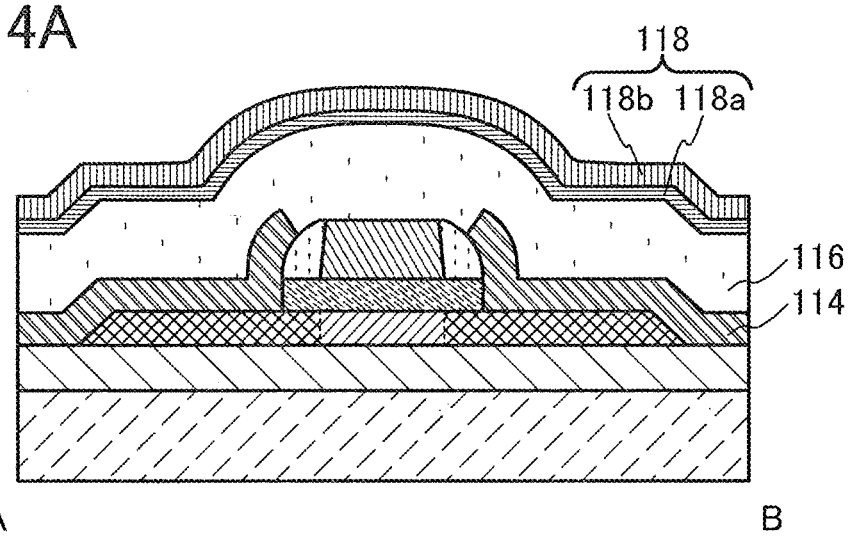
FIGS. 4A and 4B illustrate a method for manufacturing a semiconductor device, according to one embodiment of the present invention.

Next, the insulating layer 116, the first metal oxide layer 118a, and the second metal oxide layer 118b are formed in this order over the gate electrode 110, the sidewall insulating layers 112, and the pair of electrodes 114 (see FIG. 4A). Note that the specific method for forming the insulating layer 116, the first metal oxide layer 118a, and the second metal oxide layer 118b will be described in detail in Example 1.

As the insulating layer 116, one inorganic material film or stacked inorganic material films which are selected from a silicon oxide film, a silicon nitride film, a silicon oxynitride film, and a silicon nitride oxide film can be formed by a PECVD method or a sputtering method.

As in the case of the formation of the semiconductor layer 106, when one inorganic material film or stacked inorganic material films which are selected from the foregoing are deposited as the insulating layer 116, it is preferable that a deposition chamber be heated and evacuated before the deposition and that the deposition be performed in an atmosphere including a high-purity gas from which impurities such as moisture are sufficiently removed so that entry of moisture into the insulating layer 116 is suppressed as much as possible.

Alternatively, the insulating layer 116 may be formed in such a manner that a material having an insulating property is applied by a spin coating method, a printing method, a dispensing method, an ink-jet method, or the like, and cure treatment (e.g., heat treatment or light irradiation treatment) is performed depending on the applied material. As the material having an insulating property, an organic resin such as an acrylic resin, a polyimide resin, a polyamide resin, a polyamide-imide resin, or an epoxy resin, or an organic-inorganic hybrid material of organic polysiloxane and the above-mentioned inorganic material, can be used.

The insulating layer 116 is preferably formed using an insulating material having low relative permittivity so as to avoid generation of parasitic capacitance between the conductive layers (the wirings 120 in this embodiment) which are formed above the insulating layer 116 and the conductive layers (the gate electrode 110 and the pair of electrodes 114 in this embodiment) which are formed below the insulating layer 116 as much as possible. The insulating layer 116 preferably has a high barrier property against external moisture permeating the transistor 150. In view of the above, the structure in which one inorganic material film or stacked inorganic material films are used for the insulating layer 116 is favorably selected from the aforementioned structures. Note that the above organic materials are not excluded. When such an organic material is used for the insulating layer 116, it is preferable that a material with a low hygroscopic property such as a polyimide resin be used and a desiccant such as silica gel or porous alumina be mixed in the organic material.

Note that when parasitic capacitance and a barrier property which are described above, contact characteristics of the wirings 120 which are formed in a later step, and productivity are taken into account, the insulating layer 116 is preferably formed to a thickness of greater than or equal to 200 nm and less than or equal to 2000 nm in the case where an inorganic material film is used, or is preferably formed to a thickness of greater than or equal to 200 nm and less than or equal to 5000 nm in the case where an organic material film is used.

The first metal oxide layer 118a and the second metal oxide layer 118b can be formed by a sputtering method, an MBE method, a pulsed laser deposition method, an ALD method, or the like.

For the first metal oxide layer 118a, a film which is made of any one of aluminum oxide, gallium oxide, titanium oxide, zirconium oxide, hafnium oxide, vanadium oxide, niobium oxide, and molybdenum oxide and has an amorphous structure can be used. Note that the expression "having an amorphous structure" means including a region in which a clear lattice image or a clear lattice fringe is not confirmed in observation of a cross section of the first metal oxide layer 118a with a transmission electron microscope (TEM); it is preferable to use a film in which the region accounts for 60% or more, preferably 80% or more of the whole as the first metal oxide layer 118a. Note that the expression "accounting for 60% or more of the whole" can be applied to the case where an arbitrary number (one or more, preferably three or more, further preferably five or more) of parts in the first metal oxide layer 118a are observed and the region where a clear lattice image or a clear lattice fringe is not confirmed accounts for 60% or more in the observed parts.

The expression "having an amorphous structure" can also be applied to the case where film densities of an arbitrary number (one or more, preferably three or more, further preferably five or more) of parts in the cross section of the first metal oxide layer 118a are measured by X-ray reflectometry (XRR) and the film densities in all the observed parts are in a range of greater than or equal to 2.9 g/cm$^3$ and less than or equal to 3.3 g/cm$^3$.

The expression "having an amorphous structure" can also be applied to the case where electron diffraction images of an arbitrary number (one or more, preferably three or more, further preferably five or more) of parts in the cross section of the first metal oxide layer 118a are observed with a transmission electron microscope and a broad and blurred pattern (also referred to as a halo pattern, a halo ring, or a halo) is observed in all the observed parts.

The first metal oxide layer 118a "has an amorphous structure" when at least one of the above interpretations is applied to the first metal oxide layer 118a, which means that it is not necessary that all the above interpretations should be applied to the first metal oxide layer 118a.

For the second metal oxide layer 118b, a film which is made of any one of aluminum oxide, gallium oxide, titanium oxide, zirconium oxide, hafnium oxide, vanadium oxide, niobium oxide, and molybdenum oxide and has a polycrystalline structure can be used. Note that the expression "having a polycrystalline structure" means including a region in which a clear lattice image or a clear lattice fringe is confirmed in observation of a cross section of the second metal oxide layer 118b with a transmission electron microscope (TEM); it is preferable to use a film in which the region accounts for 60% or more, preferably 80% or more of the whole as the second metal oxide layer 118b. Note that the expression "accounting for 60% or more of the whole" can be applied to the case where an arbitrary number (one or more, preferably three or more, further preferably five or more) of parts in the second metal oxide layer 118b are observed and the region where a clear lattice image or a clear lattice fringe is confirmed accounts for 60% or more in the observed parts.

The expression "having a polycrystalline structure" can also be applied to the case where film densities of an arbitrary number (one or more, preferably three or more, further preferably five or more) of parts in the cross section of the second metal oxide layer 118b are measured by XRR and the film densities in all the observed parts are in a range of greater than or equal to 3.7 g/cm$^3$ and less than or equal to 4.1 g/cm$^3$.

The expression "having a polycrystalline structure" can also be applied to the case where electron diffraction images of an arbitrary number (one or more, preferably three or more, further preferably five or more) of parts in the cross section of the second metal oxide layer 118b are observed with a transmission electron microscope and a Debye-Scherrer pattern (also referred to as a Debye-Scherrer ring) is observed in all the observed parts.

The second metal oxide layer 118b "has a polycrystalline structure" when at least one of the above interpretations is applied to the second metal oxide layer 118b, which means that it is not necessary that all the above interpretations should be applied to the second metal oxide layer 118b.

Note that it is preferable that the first metal oxide layer 118a and the second metal oxide layer 118b be successively formed in the same apparatus in which high vacuum is maintained. In this manner, at the time of formation of the first metal oxide layer 118a and the second metal oxide layer 118b, entry of moisture into the films and attachment of moisture to the interface can be suppressed, whereby deterioration of the transistor due to moisture permeation can be further suppressed.

In the case where the insulating layer 116, the first metal oxide layer 118a, and the second metal oxide layer 118b are successively formed in the same apparatus with high vacuum maintained, at the time of formation of the insulating layer 116, the first metal oxide layer 118a, and the second metal oxide layer 118b, entry of moisture into the films and attachment of moisture to the interfaces can be suppressed, whereby deterioration of the transistor due to moisture permeation can be further suppressed.

Further, in the case where the first metal oxide layer 118a and the second metal oxide layer 118b are successively formed in the same apparatus with high vacuum maintained, the first metal oxide layer 118a and the second metal oxide layer 118b can be formed using the same target, in which case an increase in takt time due to transfer of a substrate from a deposition chamber to another can be suppressed. In addition, only one kind of target is needed for the formation of the metal oxide layer, so that an increase in manufacturing cost can be suppressed.

As already described above, the insulating layer 116 is formed using an insulating material having low relative permittivity so as to avoid generation of parasitic capacitance between the conductive layers (the wirings 120 in this embodiment) which are formed above the insulating layer 116 and the conductive layers (the gate electrode 110 and the pair of electrodes 114 in this embodiment) which are formed below the insulating layer 116 as much as possible. Therefore, when the second metal oxide layer 118b having a polycrystalline structure is in contact with the insulating layer 116, for example, because there is a large difference in relative permittivity between the second metal oxide layer 118b and the insulating layer 116, polarization charges from both the sides are not compensated at an interface in terms of dielectric constant (i.e., interface between the insulating layer 116 and the second metal oxide layer 118b) in some cases so that induced charges are generated to adversely affect on the channel region formed in the semiconductor layer 106. Thus, in some cases, the electrical characteristics of the transistor are adversely affected (for example, Vth (also referred to as threshold voltage) is fluctuated).

However, when the first metal oxide layer 118a having an amorphous structure is placed between the insulating layer 116 and the second metal oxide layer 118b having a polycrystalline structure as in this embodiment, the first metal oxide layer 118a has a function of filling the gap between dielectric constants of the insulating layer 116 and the second metal oxide layer 118b having a polycrystalline structure, and generation of induced charges can be suppressed; thus, a highly reliable transistor with less fluctuation in electrical characteristics such as the threshold voltage can be obtained.

Figure 4B:
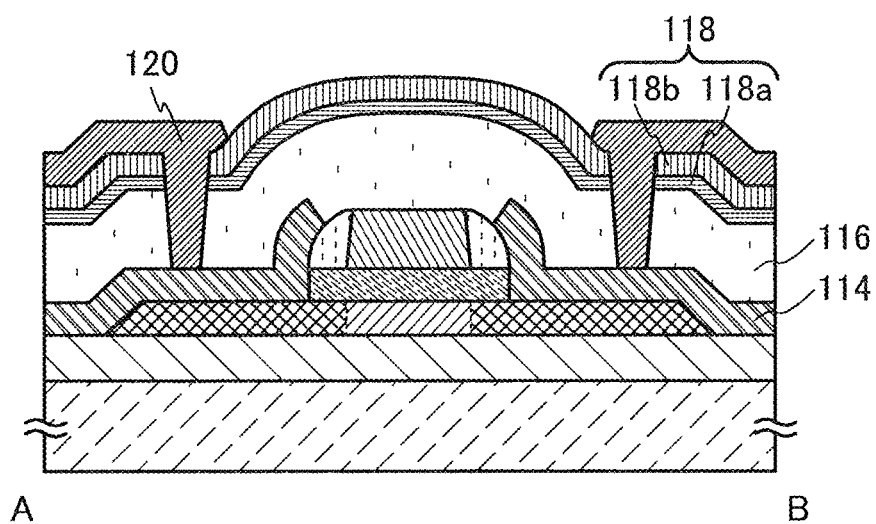

Next, opening portions reaching the pair of electrodes 114 are formed in the insulating layer 116, the first metal oxide layer 118a, and the second metal oxide layer 118b by a photolithography process or the like; then, a conductive layer is formed over the second metal oxide layer 118b and processed by a photolithography process or the like, so that the wirings 120 are formed (see FIG. 4B). Note that the conductive layer to be the wirings 120 can be formed with the use of a material and a method similar to those for the gate electrode 110.

Note that although not shown, a structure may be employed in which a protective film is provided to cover the second metal oxide layer 118b and the wirings 120. With this structure, a minute amount of leakage current generated by surface conduction of the second metal oxide layer 118b can be reduced and thus the off-state current of the transistor can be reduced.

The above is the method for manufacturing the semiconductor device of this embodiment.

In the semiconductor device manufactured by the above method, moisture permeation into the transistor 150 can be effectively suppressed owing to the insulating layer 116, the first metal oxide layer 118a, and the second metal oxide layer 118b; therefore, a semiconductor device with less fluctuation in electrical characteristics can be provided.

Embodiment 2

In this embodiment, examples of a structure and a manufacturing method of a semiconductor device whose structure is different from that of the semiconductor device described in Embodiment 1 will be described with reference to FIGS. 5A and 5B. Note that the same portions as those in Embodiment 1 and portions having functions similar to those in Embodiment 1 and the same steps as those in Embodiment 1 and steps similar to those in Embodiment 1 can be conducted as in Embodiment 1, and repeated description is omitted. In addition, detailed description of the same portions is not repeated.

(Structure and Manufacturing Method of Semiconductor Device of this Embodiment)

Figure 5A:
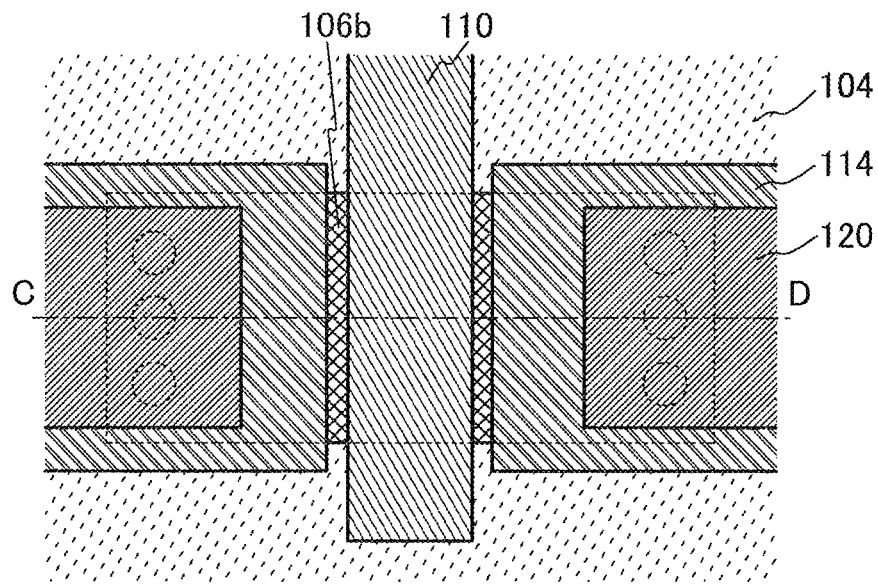
FIGS. 5A and 5B illustrate a structure of a semiconductor device according to one embodiment of the present invention.
Figure 5B:
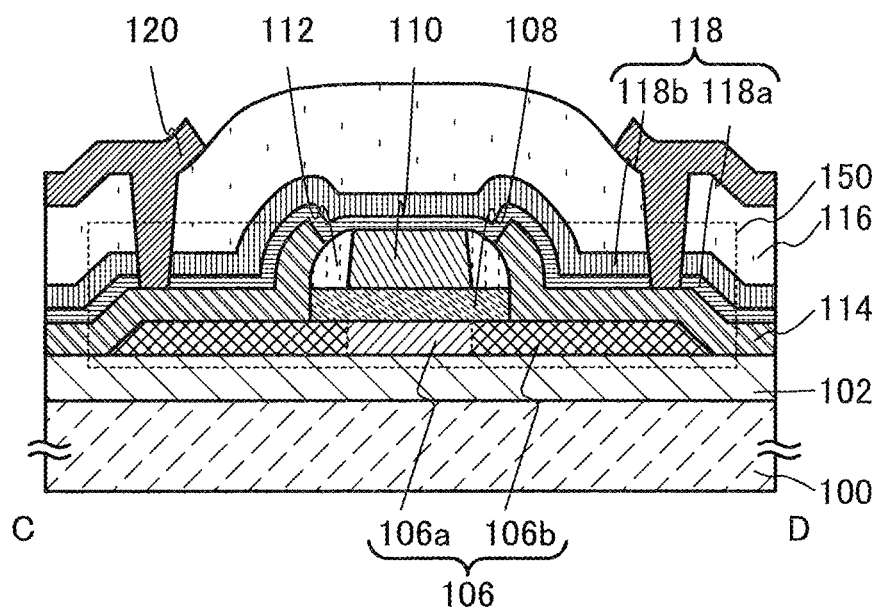

FIGS. 5A and 5B are a top view and a cross-sectional view of a semiconductor device which includes a coplanar transistor having a top-gate top-contact structure. FIG. 5A is a top view of the transistor. FIG. 5B is a cross-sectional view along dashed-dotted line C-D in FIG. 5A. Note that in FIG. 5A, some components are not shown for easy understanding of a structure of the transistor.

The semiconductor device including the transistor 150 in FIGS. 5A and 5B is different from the semiconductor device which is described in Embodiment 1 with reference to FIGS. 1A and 1B in that the metal oxide layer 118 is formed below the insulating layer 116.

As described in Embodiment 1, it is preferable that the insulating layer 116 be formed such that impurities such as moisture are not taken in the film as much as possible. However, moisture or the like may be accidentally taken in the film at the time of the film formation or the like. Although a semiconductor device having the structure described in Embodiment 1 has a high barrier property against permeation of external moisture, the first metal oxide layer 118a and the second metal oxide layer 118b can hardly suppress moisture permeation in the case where moisture is taken in the insulating layer 116 as described above, in which case the suppressing effect on fluctuation in the electrical characteristics is reduced.

However, when the semiconductor device has the structure illustrated in FIG. 5B, moisture permeation into the transistor 150 can be effectively suppressed by the first metal oxide layer 118a and the second metal oxide layer 118b even if impurities such as moisture are taken in the insulating layer 116.

As in Embodiment 1, the semiconductor device illustrated in FIGS. 5A and 5B can be manufactured in the following manner: the base insulating layer 102, the semiconductor layer 106, the gate insulating layer 108, the gate electrode 110, the sidewall insulating layers 112, and the pair of electrodes 114 are formed to complete the transistor 150; the first metal oxide layer 118a, the second metal oxide layer 118b, and the insulating layer 116 are formed in this order; and the wirings 120 connected to the pair of electrodes 114 are formed. Note that Embodiment 1 can be referred to for materials and formation methods used for the components.

Note that although the second metal oxide layer 118b is placed over the first metal oxide layer 118a, and the insulating layer 116 is placed over the second metal oxide layer 118b in FIG. 5B, the positions of the first metal oxide layer 118a and the second metal oxide layer 118b may be reversed.

The above is the structure and the manufacturing method of the semiconductor device of this embodiment.

In the semiconductor device manufactured by the above method, moisture permeation into the transistor 150 can be effectively suppressed even when moisture is taken in the insulating layer 116 at the time of formation of the insulating layer 116; therefore, a semiconductor device with less fluctuation in electrical characteristics can be provided.

Embodiment 3

In this embodiment, examples of a structure and a manufacturing method of a semiconductor device whose structure is different from that of the semiconductor device described in Embodiment 1 will be described with reference to FIGS. 6A to 6C. Note that the same portions as those in the above embodiment and portions having functions similar to those in the above embodiment and the same steps as those in the above embodiment and steps similar to those in the above embodiment can be conducted as in the above embodiment, and repeated description is omitted. In addition, detailed description of the same portions is not repeated.

Figure 6A:
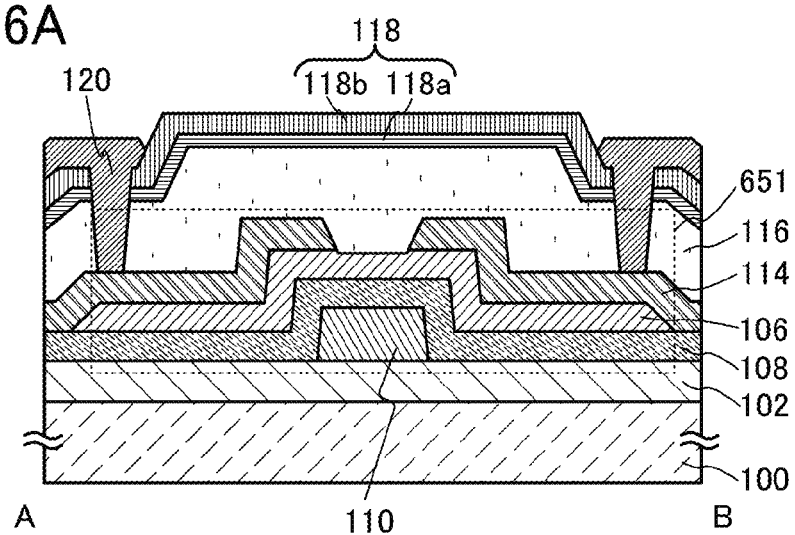
FIGS. 6A to 6C illustrate structures of a semiconductor device according to one embodiment of the present invention.
Figure 6B:
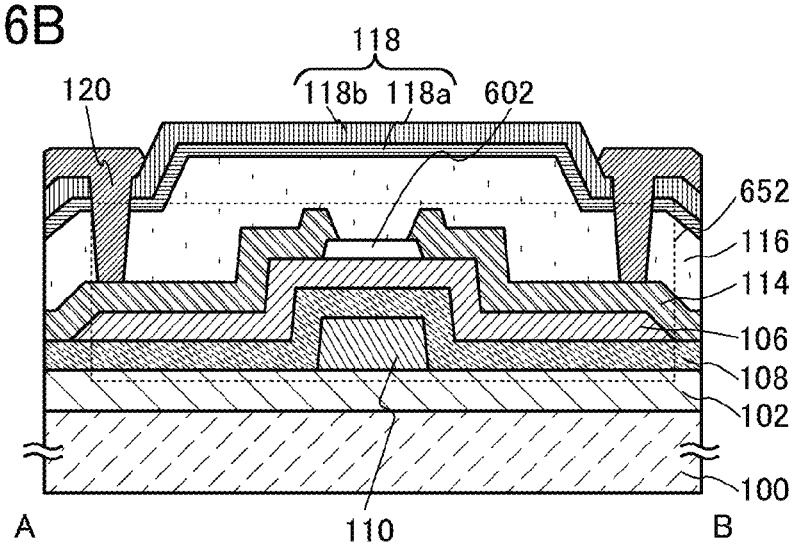
Figure 6C:
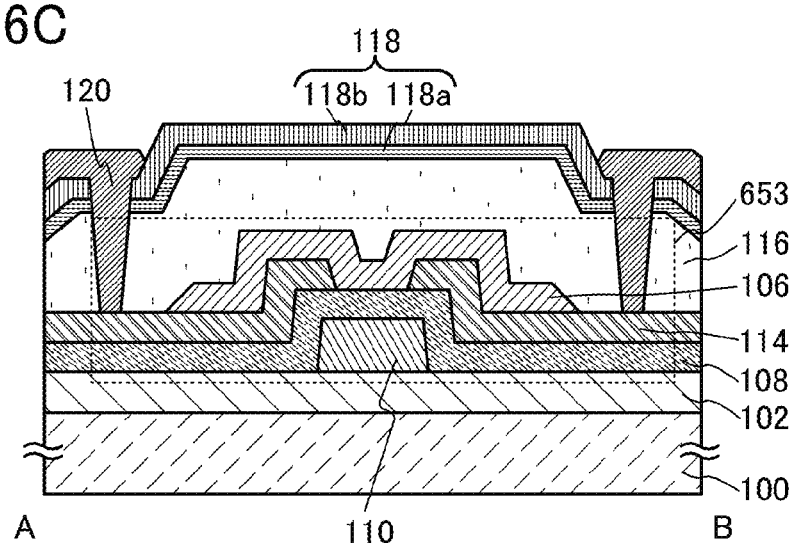

Semiconductor devices described in this embodiment with reference to FIGS. 6A to 6C are examples of a semiconductor device including a bottom-gate transistor. FIGS. 6A to 6C are cross-sectional views of a transistor 651, a transistor 652, and a transistor 653 in a channel length direction.

As a mode of the semiconductor device, a semiconductor device including the transistor 651 with a bottom-gate and top-contact structure is illustrated in FIG. 6A. The transistor 651 can also be referred to as an inverted staggered transistor.

As illustrated in FIG. 6A, the transistor 651 includes the substrate 100, the base insulating layer 102 over the substrate 100, the gate electrode 110 over the base insulating layer 102, the gate insulating layer 108 over the gate electrode 110 and the base insulating layer 102, the semiconductor layer 106 over the gate insulating layer 108, and the pair of electrodes 114 over the semiconductor layer 106. Further, over the transistor 651, there are the insulating layer 116 provided to cover the semiconductor layer 106 and the pair of electrodes 114; the first metal oxide layer 118a provided over the insulating layer 116; the second metal oxide layer 118b provided over the first metal oxide layer 118a; and the wirings 120 which are electrically connected to the pair of electrodes 114 through opening portions provided in the insulating layer 116, the first metal oxide layer 118a, and the second metal oxide layer 118b.

The above semiconductor device is different from that in the above embodiment in the formation order of the components (for example, the gate electrode 110 is formed before the gate insulating layer 108 is formed); however, materials and formation methods for the components are basically the same as those for the components in Embodiment 1 and thus the semiconductor device can be manufactured referring to the manufacturing method described in the above embodiment.

As another mode of the semiconductor device, a semiconductor device including the bottom-gate and top-contact transistor 652 with a channel-protective (channel-stop) structure is illustrated in FIG. 6B. The transistor 652 can also be referred to as an inverted staggered transistor.

As illustrated in FIG. 6B, the transistor 652 includes the substrate 100, the base insulating layer 102 over the substrate 100, the gate electrode 110 over the base insulating layer 102, the gate insulating layer 108 over the gate electrode 110 and the base insulating layer 102, the semiconductor layer 106 over the gate insulating layer 108, an insulating layer 602 over the semiconductor layer 106, and the pair of electrodes 114 over the semiconductor layer 106 and the insulating layer 602. Further, over the transistor 652, there are the insulating layer 116 provided to cover the semiconductor layer 106, the insulating layer 602, and the pair of electrodes 114; the first metal oxide layer 118a provided over the insulating layer 116; the second metal oxide layer 118b provided over the first metal oxide layer 118a; and the wirings 120 which are electrically connected to the pair of electrodes 114 through opening portions provided in the insulating layer 116, the first metal oxide layer 118a, and the second metal oxide layer 118b.

The semiconductor device is different from the semiconductor device in FIG. 6A in that the insulating layer 602 is provided over the semiconductor layer 106. When the pair of electrodes 114 are formed by etching process (e.g., dry etching process or wet etching process), the insulating layer 602 can prevent a layer below the pair of electrodes 114 from being also etched (also referred to as overetching). The above structure is preferable especially when the semiconductor layer 106 is thin. The reason for this is that electrical characteristics of the transistor 652 can considerably fluctuate when the semiconductor layer 106 having an extremely small thickness (specifically 100 nm or less, more specifically 40 nm or less, further specifically 20 nm or less) is reduced a little in thickness by etching. Note that materials and formation methods for the components are basically the same as those for the components in Embodiment 1 and thus the semiconductor device can be manufactured referring to the manufacturing method described in the above embodiment.

As a further mode of the semiconductor device, a semiconductor device including the transistor 653 with a bottom-gate and bottom-contact structure is illustrated in FIG. 6C. The transistor 653 can also be referred to as an inverted staggered transistor.

As illustrated in FIG. 6C, the transistor 653 includes the substrate 100, the base insulating layer 102 over the substrate 100, the gate electrode 110 over the base insulating layer 102, the gate insulating layer 108 over the gate electrode 110 and the base insulating layer 102, the pair of electrodes 114 over the gate insulating layer 108, and the semiconductor layer 106 over the gate insulating layer 108 and the pair of electrodes 114. Further, over the transistor 653, there are the insulating layer 116 provided to cover the semiconductor layer 106 and the pair of electrodes 114; the first metal oxide layer 118a provided over the insulating layer 116; the second metal oxide layer 118b provided over the first metal oxide layer 118a; and the wirings 120 which are electrically connected to the pair of electrodes 114 through opening portions provided in the insulating layer 116, the first metal oxide layer 118a, and the second metal oxide layer 118b.

The semiconductor device is different from the semiconductor device in FIG. 6A in that the pair of electrodes 114 are formed before the semiconductor layer 106 is formed; however, materials and formation methods for the components are basically the same as those for the components in Embodiment 1 and thus the semiconductor device can be manufactured referring to the manufacturing method described in the above embodiment.

Note that although the first metal oxide layer 118a and the second metal oxide layer 118b are placed over the insulating layer 116 in FIGS. 6A to 6C, a structure may be employed in which the first metal oxide layer 118a and the second metal oxide layer 118b are placed below the insulating layer 116 as in Embodiment 2. For a structure and a manufacturing method in such a case, this embodiment and Embodiment 2 can be referred to.

The above is the structures and the manufacturing methods of the semiconductor devices of this embodiment.

Embodiment 4

In this embodiment, the case where the semiconductor device described in the above embodiment is applied to an electronic appliance will be described with reference to FIGS. 7A to 7C. In this embodiment, the case where the above-described semiconductor device is applied to an electronic appliance such as a computer, a portable information terminal (including a mobile phone, a portable game machine, an audio reproducing device, and the like), electronic paper, a television set (also referred to as television or television receiver), or a digital video camera is described.

Figure 7A:
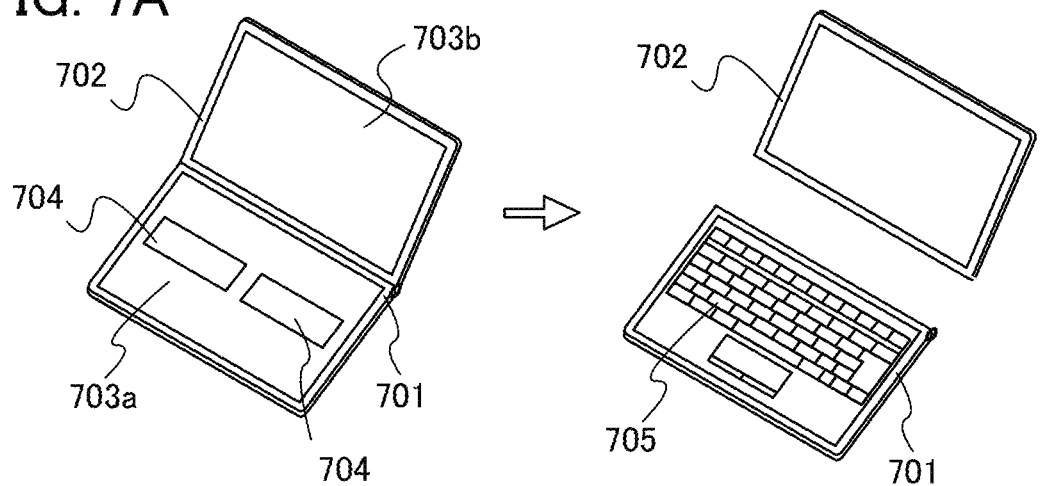
FIGS. 7A to 7C illustrate examples of an electronic appliance using a semiconductor device according to one embodiment of the present invention.

FIG. 7A illustrates a portable information terminal, which includes a housing 701, a housing 702, a first display portion 703a, a second display portion 703b, and the like. A variety of electronic components (e.g., CPU, MPU, or a memory element) are incorporated inside the housing 701 and the housing 702. Further, electronic circuits (e.g., a driver circuit or a selection circuit) necessary for displaying an image are mounted on the first display portion 703a and the second display portion 703b. In these electronic components and electronic circuits, the semiconductor devices according to any of the above embodiments in which moisture permeation into the transistors is suppressed are provided. Thus, in the portable information terminal, degradation of performance (e.g., in the case of a memory element, storing of false data which is caused by fluctuation in threshold voltage of a semiconductor device in the memory element; in the case of a driving device, output of false driving signals which is caused by fluctuation in threshold voltage of a semiconductor device in the driving device) is suppressed for a long period. Note that the semiconductor device according to any of the above embodiments may be provided in at least one of the housing 701 and the housing 702.

At least one of the first display portion 703a and the second display portion 703b has a touch input function, and for example, as illustrated in a left part of FIG. 7A, which of "touch input" and "keyboard input" is performed can be selected by selection buttons 704 displayed on the first display portion 703a. Because the selection buttons with a variety of sizes can be displayed, the portable information terminal can be easily used by people of any generation. In the case where "keyboard input" is selected, for example, a keyboard 705 is displayed on the first display portion 703a as illustrated in a right part of FIG. 7A. With the keyboard 705, letters can be input quickly by keyboard input as in the case of using a conventional information terminal, for example.

Further, the housing 701 and the housing 702 of the portable information terminal in FIG. 7A can be separated as illustrated in the right part of FIG. 7A. This structure enables very convenient operations; for example, screen data can be controlled from the housing 701 while the screen data is shared by a plurality of people with the housing 702 hung on a wall. Note that in the case where the device is not in use, the housing 701 and the housing 702 are preferably made to overlap such that the first display portion 703a faces the second display portion 703b. In this manner, the first display portion 703a and the second display portion 703b can be protected from an external shock.

The portable information terminal illustrated in FIG. 7A can have a function of displaying various kinds of information (e.g., a still image, a moving image, and a text image), a function of displaying a calendar, a date, the time, or the like on the display portion, a function of handling or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 7A may transmit and receive data wirelessly. Through wireless communication, desired book data or the like can be purchased and downloaded from an electronic book server.

Further, the housings 701 and 702 illustrated in FIG. 7A may be equipped with an antenna, a microphone function, or a wireless communication function to be used as a mobile phone.

Figure 7B:
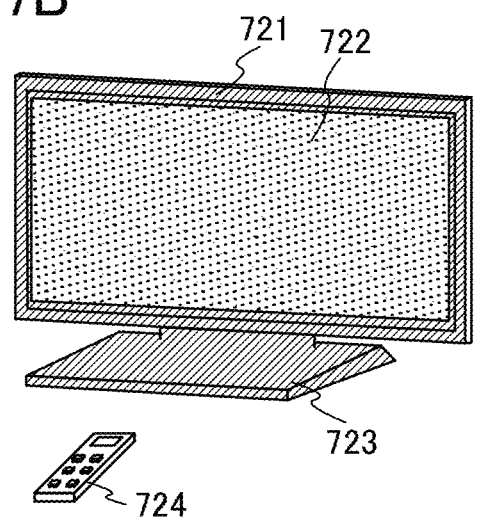

FIG. 7B shows a television device including a housing 721, a display portion 722, a stand 723, a remote controller 724, and the like. Also in the television device, a variety of electronic components and electronic circuits are incorporated in (or mounted on) the housing 721 and the display portion 722 as in the aforementioned portable information terminal. In these electronic components and electronic circuits, the semiconductor devices according to any of the above embodiments in which moisture permeation into the transistors is suppressed are provided, whereby in the television device, degradation of performance is suppressed for a long period.

Figure 7C:
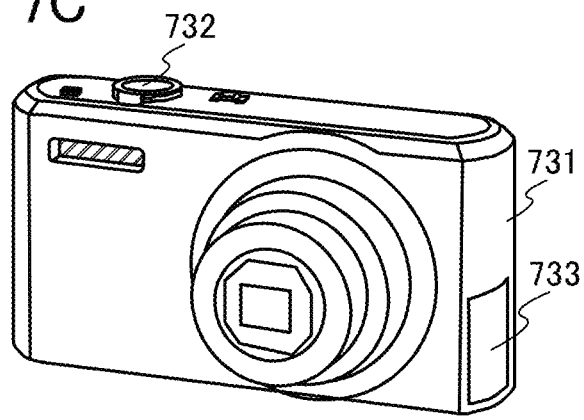

FIG. 7C illustrates a digital camera including a housing 731, an operation switch 732, a battery 733, and the like. Further, the digital camera is provided with a display portion (not illustrated but positioned on the back surface of the main body) and the like on its back surface. The semiconductor devices according to any of the above embodiments are also provided in the housing 731 or the display portion of the digital camera. Thus, in the digital camera, degradation of performance is suppressed for a long period.

As described above, the semiconductor device according to any of the above embodiments is mounted on each of the electronic appliances described in this embodiment. Accordingly, power consumption can be reduced in the electronic appliances.

Example 1

In this example, a specific example of the method for forming the insulating layer 116, the first metal oxide layer 118a, and the second metal oxide layer 118b in Embodiment 1 will be described. Results of some kinds of analysis of the layers will also be described.

For the insulating layer 116, a silicon oxide film was formed with a sputtering apparatus. Formation conditions of the insulating layer 116, which was formed to a thickness of 400 nm, were as follows: silicon was used as a target, substrate temperature was room temperature, $O_2$ was 100% in a deposition atmosphere, the flow rate of the $O_2$ gas was 300 sccm, pressure inside a chamber was 0.7 Pa, a power source was an AC power source, and a power of 6 kW was applied.

Then, the metal oxide layer 118 was formed successively without exposure to the air in the apparatus that was used for the insulating layer 116. Thus, adsorption of moisture at the interface between the insulating layer 116 and the metal oxide layer 118 can be suppressed.

For the metal oxide layer 118, an aluminum oxide film was formed to a thickness of 50 nm under the following conditions: pure aluminum was used as a target, substrate temperature was 150° C., $O_2$ was 100% in a deposition atmosphere, the flow rate of the $O_2$ gas was 300 sccm, pressure inside the chamber was 0.7 Pa, a power source was an AC power source, and a power of 30 kW was applied.

Figure 8:
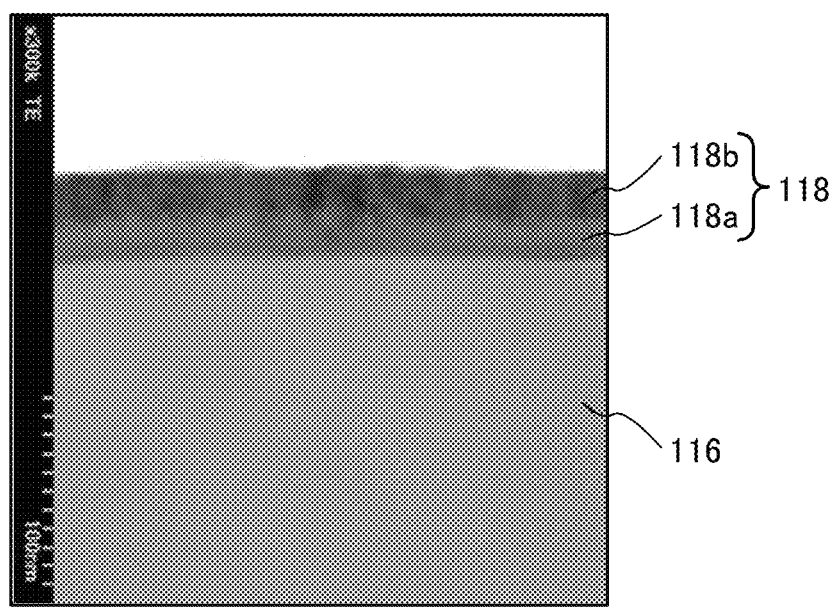
FIG. 8 shows a state of a cross section of a semiconductor device according to one embodiment of the present invention.

FIG. 8 shows an image of a cross section of the metal oxide layer 118 formed over the insulating layer 116 observed with a scanning transmission electron microscope (STEM). As shown in FIG. 8, the metal oxide layer 118 has a two-layer structure in which the first metal oxide layer 118a and the second metal oxide layer 118b are successively stacked. This structure was formed in the following manner: in an early stage of the formation of the metal oxide layer 118, elements of the layer below the metal oxide layer 118 (here, the silicon oxide film) were sputtered out by main elements (here, aluminum and oxygen) of the metal oxide layer 118, which was formed with application of high power, and were mixed into the metal oxide layer 118 (this is referred to as a mixing effect) to hinder crystallization in the metal oxide layer 118, whereby the first metal oxide layer 118a having an amorphous structure was formed; then, as the film formation proceeded, the mixing effect was reduced, so that the second metal oxide layer 118b having a polycrystalline structure was formed.

Note that in the formation of the aluminum oxide film, by adjusting the atmosphere and pressure in the chamber, and power to apply, thicknesses of the layers (the first metal oxide layer 118a and the second metal oxide layer 118b) in the above-mentioned two-layer structure can be deliberately adjusted.

Note that although this example describes successive stacking of the first metal oxide layer 118a and the second metal oxide layer 118b with the use of aluminum oxide, it is needless to say that also in the case of using a different kind of metal oxide, a structure in which layers are successively stacked may be formed by adjusting parameters in the film formation as described above.

To examine film qualities of the first metal oxide layer 118a and the second metal oxide layer 118b, film densities at three points in each of the layers were measured by XRR. As a result, it was found that the film densities in the first metal oxide layer 118a were 3.04 g/cm$^3$, 3.02 g/cm$^3$, and 3.02 g/cm$^3$, and the film densities in the second metal oxide layer 118b were 3.80 g/cm$^3$, 3.78 g/cm$^3$, and 3.76 g/cm$^3$. The measurement results indicate that the first metal oxide layer 118a is aluminum oxide having an amorphous structure and the second metal oxide layer 118b is aluminum oxide having a polycrystalline structure.

This example describes the case where aluminum oxide was used for the first metal oxide layer 118a and the second metal oxide layer 118b; however, also in the case where a different kind of metal oxide is used, the state of a layer (e.g., whether an amorphous state or a polycrystalline state) can be examined by measuring film density by XRR and comparing the measurement results with values in literature or the like.

This example can be implemented in combination with any of the other embodiments as appropriate.

This application is based on Japanese Patent Application serial no. 2011-208468 filed with Japan Patent Office on Sep. 26, 2011, the entire contents of which are hereby incorporated by reference.

What is claimed is:

1. A semiconductor device comprising:
   a semiconductor layer;
   a gate insulating layer adjacent to the semiconductor layer;
   a gate electrode adjacent to the semiconductor layer with the gate insulating layer interposed therebetween;
   a pair of electrodes electrically connected to the semiconductor layer;
   a metal oxide layer covering the pair of electrodes; and
   a pair of wirings electrically connected to the pair of electrodes, respectively, through openings opened in the metal oxide layer,
   wherein the metal oxide layer has a stacked-layer structure at least comprising:
   a first metal oxide layer having an amorphous structure; and
   a second metal oxide layer having a polycrystalline structure.

2. The semiconductor device according to claim 1, further comprising an insulating layer between the pair of electrodes and the metal oxide layer.

3. The semiconductor device according to claim 1, further comprising an insulating layer over the metal oxide layer.

4. The semiconductor device according to claim 1, further comprising an insulating layer over the metal oxide layer,
   wherein the first metal oxide layer is placed over the pair of electrodes, and
   wherein the second metal oxide layer is placed over the first metal oxide layer.

5. The semiconductor device according to claim 1, further comprising an insulating layer over the pair of electrodes,
wherein the first metal oxide layer is placed over the insulating layer, and
wherein the second metal oxide layer is placed over the first metal oxide layer.

6. The semiconductor device according to claim 1, wherein the semiconductor layer is a film including an oxide semiconductor material.

7. The semiconductor device according to claim 1,
wherein the pair of electrodes are in contact with a top surface of the semiconductor layer, and
wherein the gate electrode is placed over the semiconductor layer.

8. The semiconductor device according to claim 1,
wherein the semiconductor layer is placed over the gate electrode, and
wherein the pair of electrodes are in contact with a top surface of the semiconductor layer.

9. The semiconductor device according to claim 1,
wherein the semiconductor layer is placed over the gate electrode, and
wherein the semiconductor layer is in contact with top surfaces of the pair of electrodes.

10. A semiconductor device comprising:
a semiconductor region;
a gate insulating layer over the semiconductor region;
a gate electrode over the gate insulating layer;
a metal oxide layer over the gate electrode; and
a pair of wirings over the metal oxide layer, the pair of wirings being electrically connected to the semiconductor region through openings opened in the metal oxide layer,
wherein the metal oxide layer has a stacked layer structure at least comprising:
a first metal oxide layer having an amorphous structure; and
a second metal oxide layer having a polycrystalline structure.

11. The semiconductor device according to claim 10, further comprising an insulating layer between the gate electrode and the metal oxide layer.

12. The semiconductor device according to claim 10, further comprising an insulating layer over the metal oxide layer.

13. The semiconductor device according to claim 10, wherein the semiconductor region includes an oxide semiconductor material.

14. A semiconductor device comprising:
an oxide semiconductor layer;
a gate insulating layer over the oxide semiconductor layer;
a gate electrode over the gate insulating layer;
an insulating layer including silicon oxynitride over the gate electrode;
a first metal oxide layer including aluminum oxide over the insulating layer;
a second metal oxide layer including aluminum oxide over the first metal oxide layer; and
a pair of wirings over the second metal oxide layer, the pair of wirings being electrically connected to the oxide semiconductor layer through openings opened in the first metal oxide layer and the second metal oxide layer.

15. The semiconductor device according to claim 14, wherein the first metal oxide layer has an amorphous structure, and the second metal oxide layer has a polycrystalline structure.

16. The semiconductor device according to claim 14, wherein the second metal oxide layer is in contact with the first metal oxide layer.

* * * * *